(12) United States Patent
Zaleski et al.

(10) Patent No.: US 9,461,128 B2
(45) Date of Patent: Oct. 4, 2016

(54) METHOD FOR CREATING SELF-ALIGNED TRANSISTOR CONTACTS

(71) Applicant: GLOBALFOUNDRIES INC., Grand Cayman (KY)

(72) Inventors: Mark A. Zaleski, Galway, NY (US); Andy Chih-Hung Wei, Queensbury, NY (US); Jason E. Stephens, Cohoes, NY (US); Tuhin Guha Neogi, Clifton Park, NY (US); Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/963,789

(22) Filed: Dec. 9, 2015

(65) Prior Publication Data

US 2016/0093704 A1    Mar. 31, 2016

Related U.S. Application Data

(62) Division of application No. 14/184,830, filed on Feb. 20, 2014, now Pat. No. 9,236,437.

(51) Int. Cl.
| | |
|---|---|
| *H01L 29/417* | (2006.01) |
| *H01L 21/82* | (2006.01) |
| *H01L 29/66* | (2006.01) |
| *H01L 29/51* | (2006.01) |
| *H01L 27/088* | (2006.01) |
| *H01L 29/78* | (2006.01) |
| *H01L 21/8234* | (2006.01) |
| *H01L 21/8238* | (2006.01) |
| *H01L 29/165* | (2006.01) |

(52) U.S. Cl.
CPC ...... *H01L 29/41758* (2013.01); *H01L 21/8234* (2013.01); *H01L 21/823814* (2013.01); *H01L 21/823871* (2013.01); *H01L 27/088* (2013.01); *H01L 27/0886* (2013.01); *H01L 29/518* (2013.01); *H01L 29/66348* (2013.01); *H01L 29/66484* (2013.01); *H01L 29/66545* (2013.01); *H01L 29/66613* (2013.01); *H01L 29/66621* (2013.01); *H01L 29/66727* (2013.01); *H01L 29/66795* (2013.01); *H01L 29/785* (2013.01); *H01L 29/165* (2013.01); *H01L 29/7848* (2013.01)

(58) Field of Classification Search
CPC ............... H01L 29/41758; H01L 21/823871; H01L 29/66621; H01L 21/8234; H01L 29/66348

See application file for complete search history.

(56) References Cited

U.S. PATENT DOCUMENTS

| 8,436,404 B2 | 5/2013 | Bohr et al. |
|---|---|---|
| 2012/0299125 A1 | 11/2012 | Guo et al. |
| 2015/0076624 A1* | 3/2015 | Liu .................. H01L 21/32115 257/412 |

* cited by examiner

*Primary Examiner* — Thanhha Pham
(74) *Attorney, Agent, or Firm* — Williams Morgan, P.C.

(57) ABSTRACT

Embodiments of the present invention provide improved methods of contact formation. A self aligned contact scheme with reduced lithography requirements is disclosed. This reduces the risk of shorts between source/drains and gates, while providing improved circuit density. Cavities are formed adjacent to the gates, and a fill metal is deposited in the cavities to form contact strips. A patterning mask is then used to form smaller contacts by performing a partial metal recess of the contact strips.

7 Claims, 23 Drawing Sheets

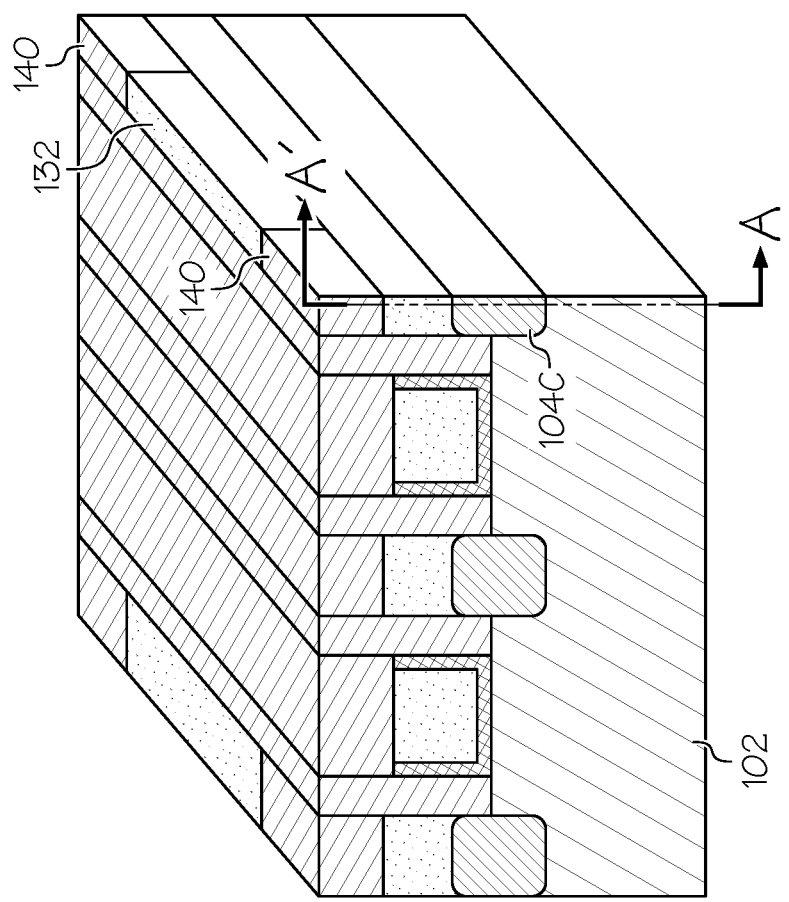
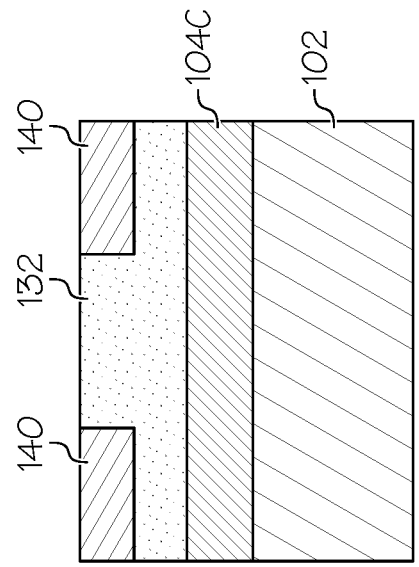
FIG. 12A
FIG. 12B

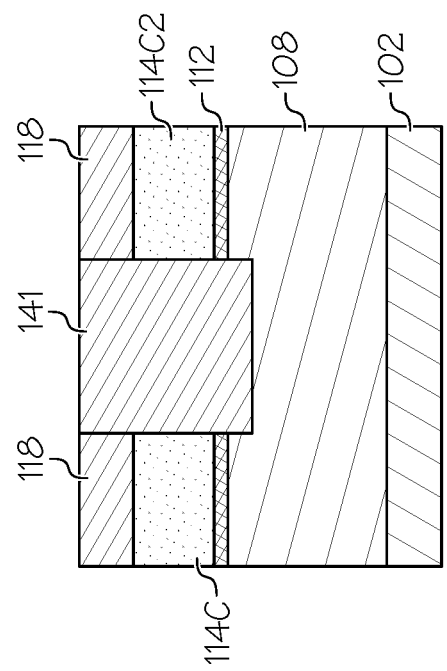
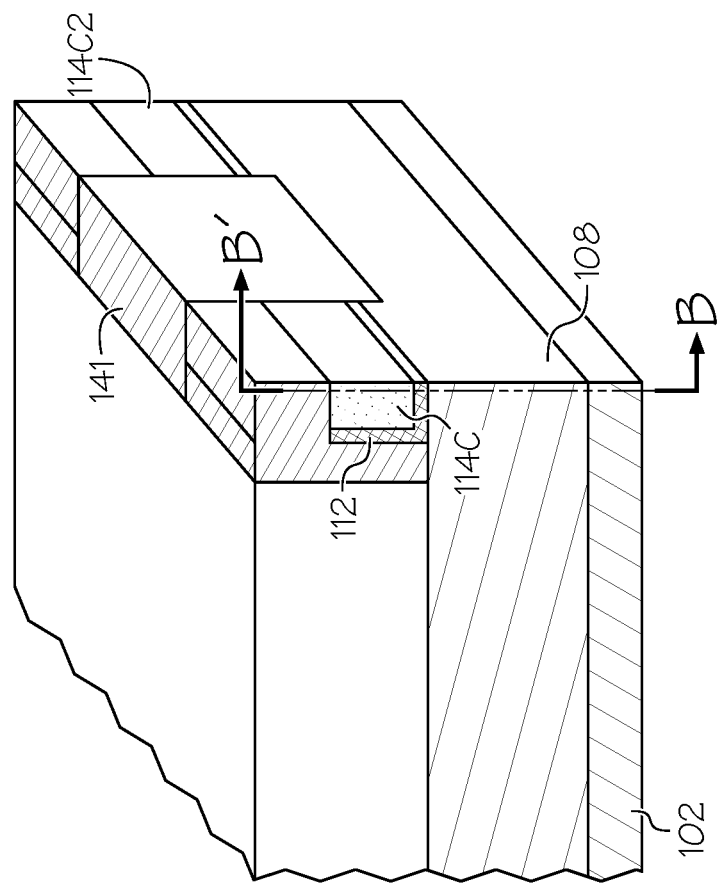

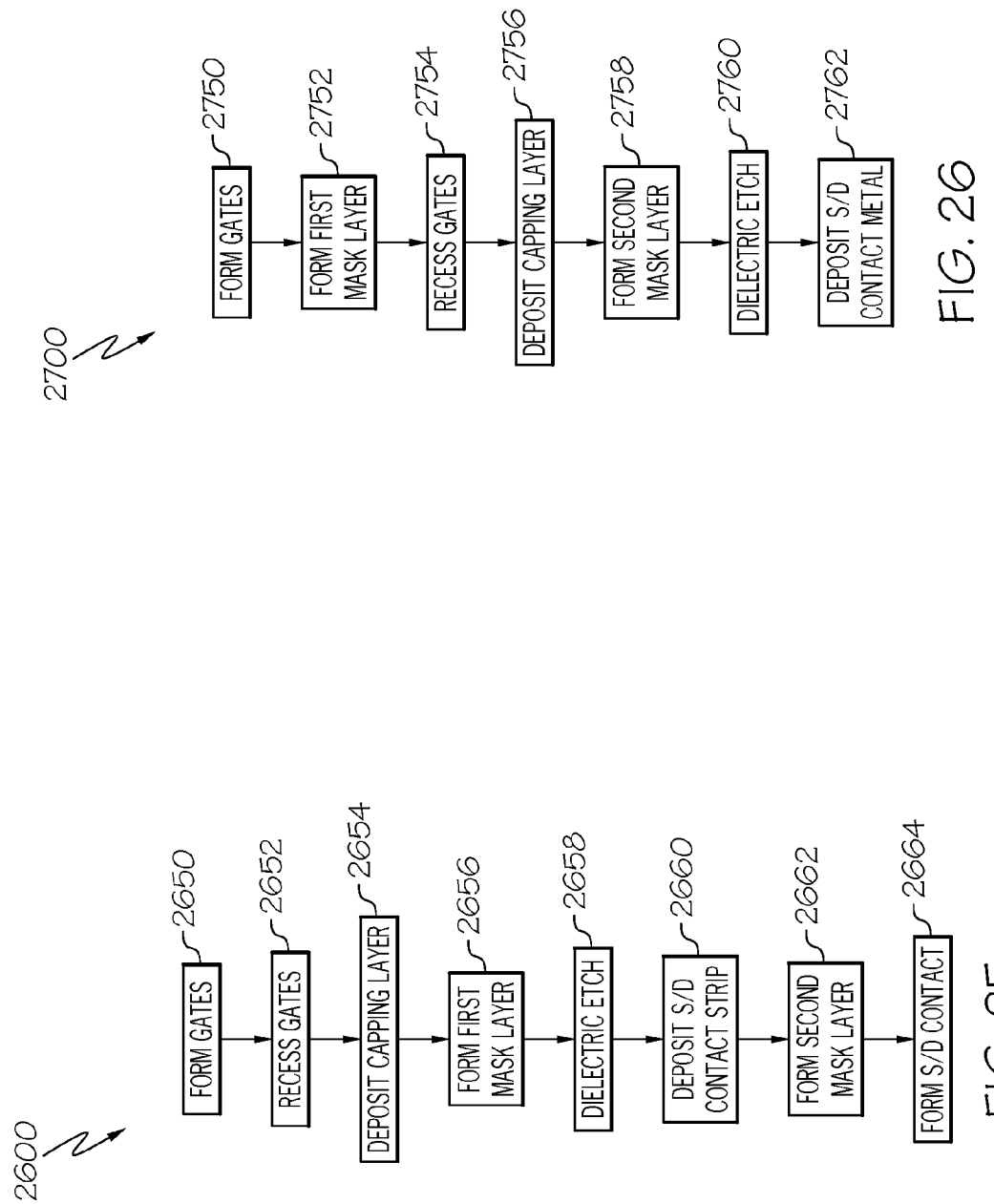

METHOD FOR CREATING SELF-ALIGNED TRANSISTOR CONTACTS

CROSS-REFERENCE TO RELATED APPLICATIONS

This application is a divisional of co-pending application Ser. No. 14/184,830 filed Feb. 20, 2014.

FIELD OF THE INVENTION

The present invention relates generally to semiconductor fabrication, and more particularly, to methods for creating self-aligned transistor contacts.

BACKGROUND

As integrated circuits continue to scale downward in size, the finFET (fin field effect transistor) is becoming an attractive device for use in semiconductor integrated circuits (ICs). In a finFET, the channel is formed by a semiconductor vertical fin, and a gate electrode is located and wrapped around the fin. With finFETs, as with other transistor types, the contacts that connect the source, drain, and gate of the transistor are an important factor in the production of smaller integrated circuits with desired performance and reliability characteristics. It is therefore desirable for cost reasons to push the limits of single patterning in the advanced CMOS nodes at 14 nm and below. Indeed, multiple patterning in the absence of production-worthy EUV lithography equipment is cost prohibitive and results in a paradigm shift in the sense that for the first time in the industry, the case for higher density is not clear in view of associated cost.

SUMMARY

Embodiments of the present invention provide improved methods of contact formation. It is desirable to have a middle-of-line (MOL) structure that is very dense, yet having good manufacturability. With increased density, the opportunity for unwanted contact shorts between source/drain contacts and gate contacts increases. Embodiments of the present invention provide a self aligned contact scheme with reduced lithography requirements. This reduces the risk of shorts between source/drains and gates, while providing improved MOL density. Embodiments of the present invention, by means of new integration schemes involving partial metal recess and material selectivity at etch, enable a manufacturing technology with high density at the contact level while still making use of lithography with relaxed specification as compared to methods known in prior art techniques.

In a first aspect, embodiments of the present invention provide a method of forming a semiconductor structure, comprising: forming a plurality of gates in a dielectric layer; recessing the plurality of gates; depositing a capping layer over the plurality of gates; forming a first mask layer having a patterned opening therein; performing a selective dielectric etch within the patterned opening to form a plurality of source/drain (S/D) cavities; depositing a source/drain contact metal in the S/D cavities to form a plurality of contact strips; forming a second mask layer comprising a plurality of regions disposed over a portion of the capping layer and a portion of an adjacent contact strip of the plurality of contact strips; and performing an etch of the adjacent contact strip to form a source/drain contact.

In a second aspect, embodiments of the present invention provide a method of forming a semiconductor structure, comprising: forming a plurality of gates in a dielectric layer; depositing a first patterned mask over the plurality of gates disposed in a dielectric layer; performing a recess of the plurality of gates; depositing a capping layer over the plurality of gates; depositing a second mask layer having a patterned opening therein, the patterned opening disposed over the capping layer and a region adjacent to the capping layer; performing a selective dielectric etch within the patterned opening to form a plurality of source/drain (S/D) cavities; and depositing an S/D contact metal in the S/D cavities.

In a third aspect, embodiments of the present invention provide a semiconductor structure comprising: a semiconductor substrate; a plurality of transistors formed in the semiconductor substrate, wherein each transistor comprises a gate and a plurality of source/drain regions; a dielectric layer disposed on the semiconductor substrate; and a contact formed on at least one of the plurality of source/drain regions, wherein the contact comprises an upper portion and a lower portion, and wherein the lower portion is wider than the upper portion.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Often, similar elements may be referred to by similar numbers in various figures (FIGs) of the drawing, in which case typically the last two significant digits may be the same, the most significant digit being the number of the drawing figure (FIG.).

Note that while the figures herein have been drawn for illustration with a planar CMOS technology, embodiments of the present invention are applicable for both planar CMOS and FinFET

FIG. 12A is a perspective view of a semiconductor structure after formation of a source/drain contact in accordance with illustrative embodiments.

FIG. 12B is a side view of a semiconductor structure after formation of a source/drain contact in accordance with illustrative embodiments.

FIG. 13A is a perspective view of a semiconductor structure after a gate cut process in accordance with illustrative embodiments.

FIG. 13B is a side view of a semiconductor structure after a gate cut process in accordance with illustrative embodiments.

FIG. 25 is a flowchart indicating process steps for embodiments of the present invention.

FIG. 26 is a flowchart indicating process steps for alternative embodiments of the present invention.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
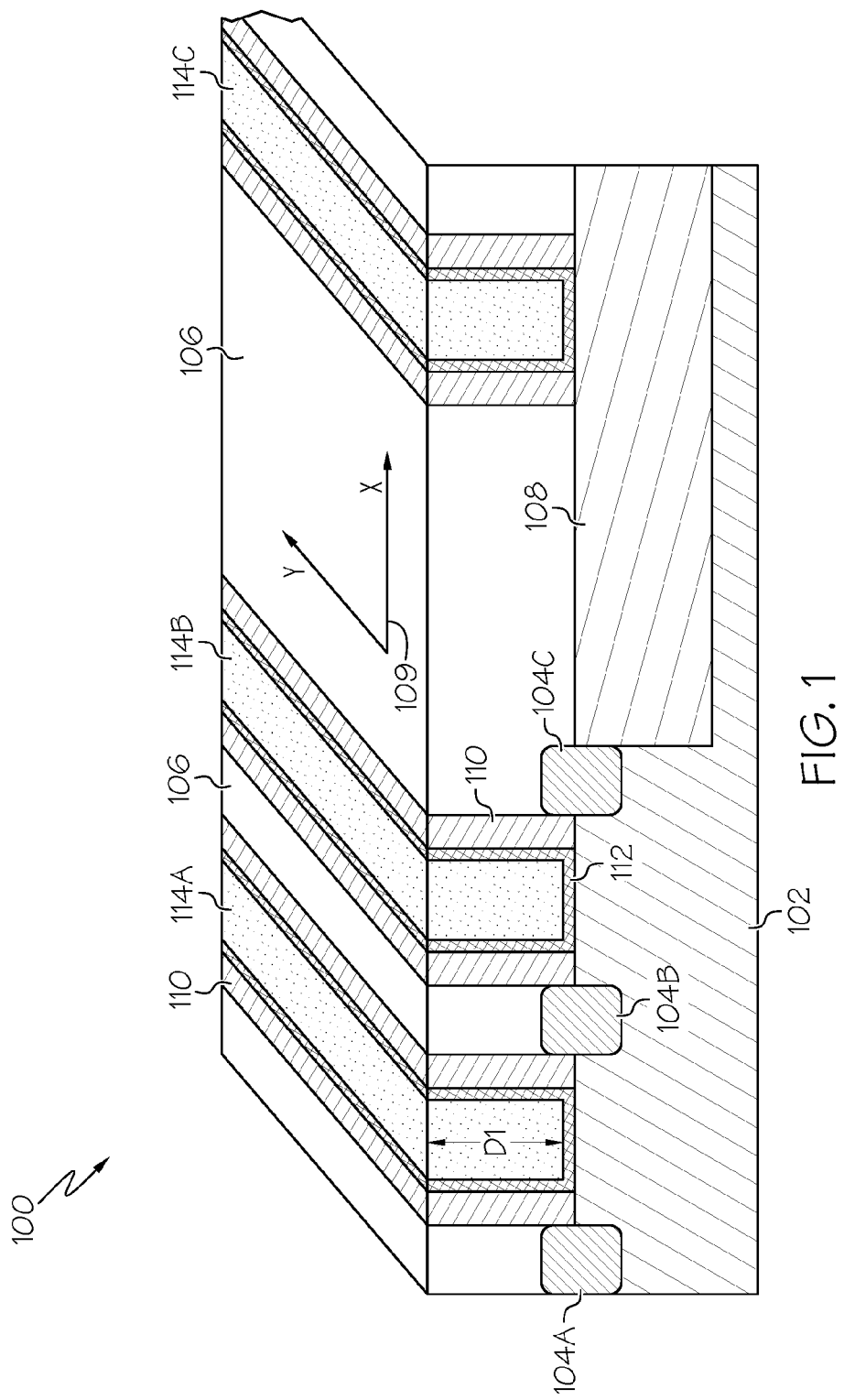
FIG. 1 is a semiconductor structure at a starting point for embodiments of the present invention.

FIG. 1 is a semiconductor structure 100 at a starting point for embodiments of the present invention. Semiconductor structure 100 includes a semiconductor substrate 102, which may include a silicon substrate, and may be in the form of a silicon wafer. A plurality of source/drain regions (104A, 104B, and 104C) are formed in the semiconductor substrate 102. In embodiments, the source/drain (S/D) regions 104A, 104B, and 104C may be raised source/drain (RSD) structures. The S/D regions may comprise doped silicon regions, and may include additional epitaxial material such as silicon, silicon germanium, and/or additional materials for the purposes of inducing stress to increase carrier mobility. An interlayer dielectric (ILD) 106 is formed over the semiconductor substrate 102. In embodiments, the ILD 106 may be comprised of an oxide, such as silicon oxide, and may be formed using a chemical vapor deposition (CVD) process. A plurality of gates 114A, 114B, and 114C are formed in the semiconductor structure. The plurality of gates 114A, 114B, and 114C may be comprised of metal, and may be formed using a replacement metal gate (RMG) process. In embodiments, the gates 114A, 114B, and 114C may be comprised of tungsten. In some embodiments, the gates 114A, 114B and 114C may be comprised of tungsten for the fill metal, with underlying workfunction altering thinner layers of TiN, TaN or TiAl. The gates 114A, 114B, and 114C have a thickness D1. In embodiments, D1 may range from about 100 nanometers to about 200 nanometers. As shown in the cross section of FIG. 1, gates 114A and 114B are disposed between S/D regions. Gate 114C is disposed over a shallow trench isolation (STI) region 108. In embodiments, the STI region 108 may be comprised of an oxide, such as silicon oxide. A gate dielectric layer 112 is in contact with the gates (114A, 114B, and 114C). In embodiments, the gate dielectric layer 112 may comprise an oxide. In some embodiments, the gate dielectric layer 112 may comprise a high-K material, such as hafnium oxide or zirconium oxide. Spacers 110 are formed adjacent to the gates. In embodiments, the spacers 110 may be formed of a nitride dielectric, such as silicon nitride or a lower k SiOCN material. As indicated by legend 109, the gates 114A, 114B, and 114C are oriented along the Y axis, and are separated along the X axis. Embodiments of the present invention provide contacts that are self-aligned along the X-axis, with reduced lithographic requirements.

Figure 2:
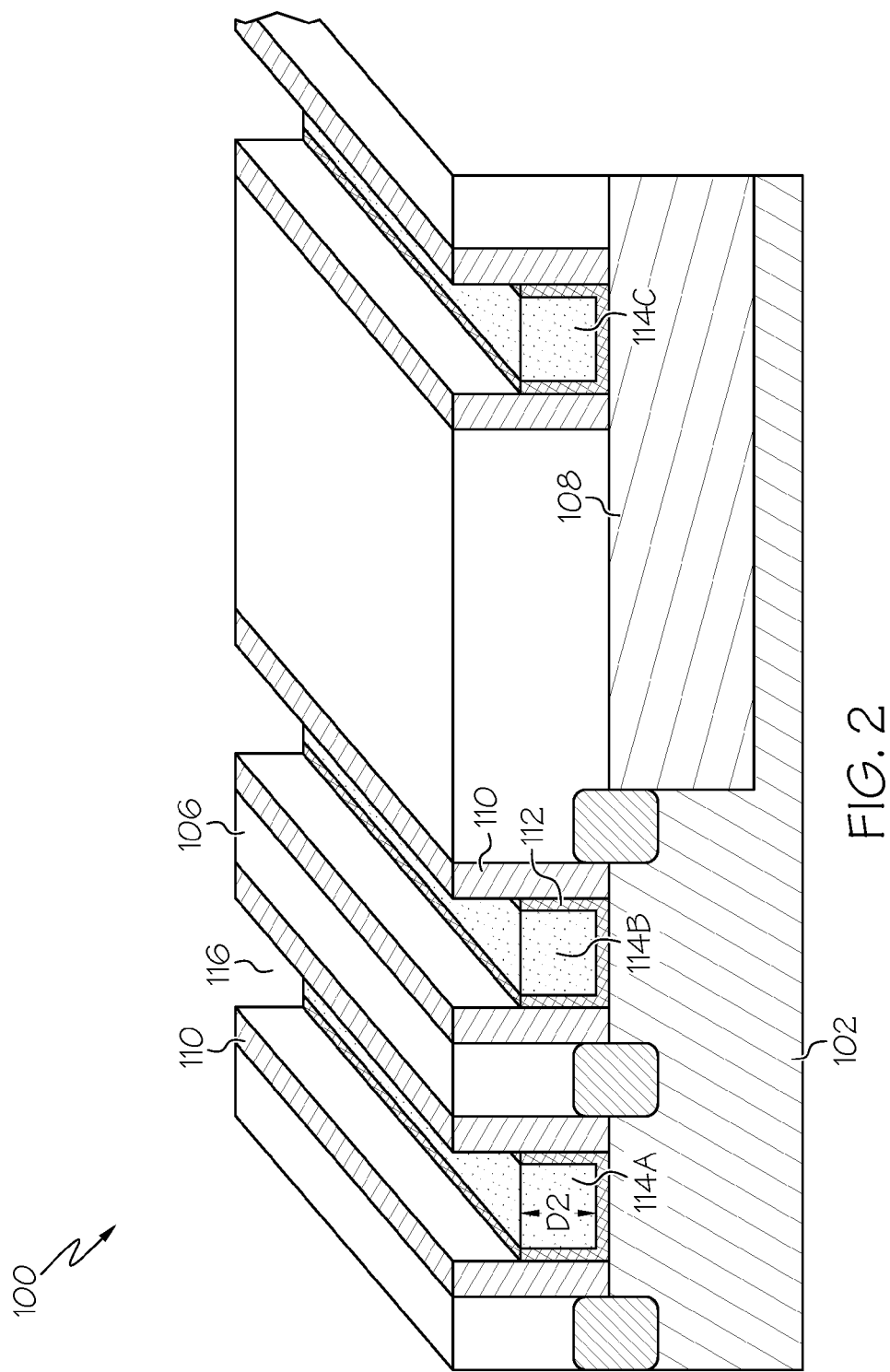
FIG. 2 is a semiconductor structure after a subsequent process step of performing a gate metal recess in accordance with illustrative embodiments.

FIG. 2 is semiconductor structure 100 after a subsequent process step of performing a gate metal recess in accordance with illustrative embodiments. A selective etch process is used to etch the metal gate material to a reduced thickness D2 (compared with D1 of FIG. 1), resulting in formation of a cavity (trench) 116 where the gate material is removed. In embodiments, the thickness D2 ranges from about 50 nanometers to about 90 nanometers. The selective etch process may include a wet etch, dry etch, or combination of the two. The selective etch has a much faster etch rate for metal than for silicon-based oxide or nitride, so the ILD 106 and spacers 110 are preserved, whereas the gates 114A, 114B, and 114C, along with the corresponding gate dielectric 112, are recessed.

Figure 3:
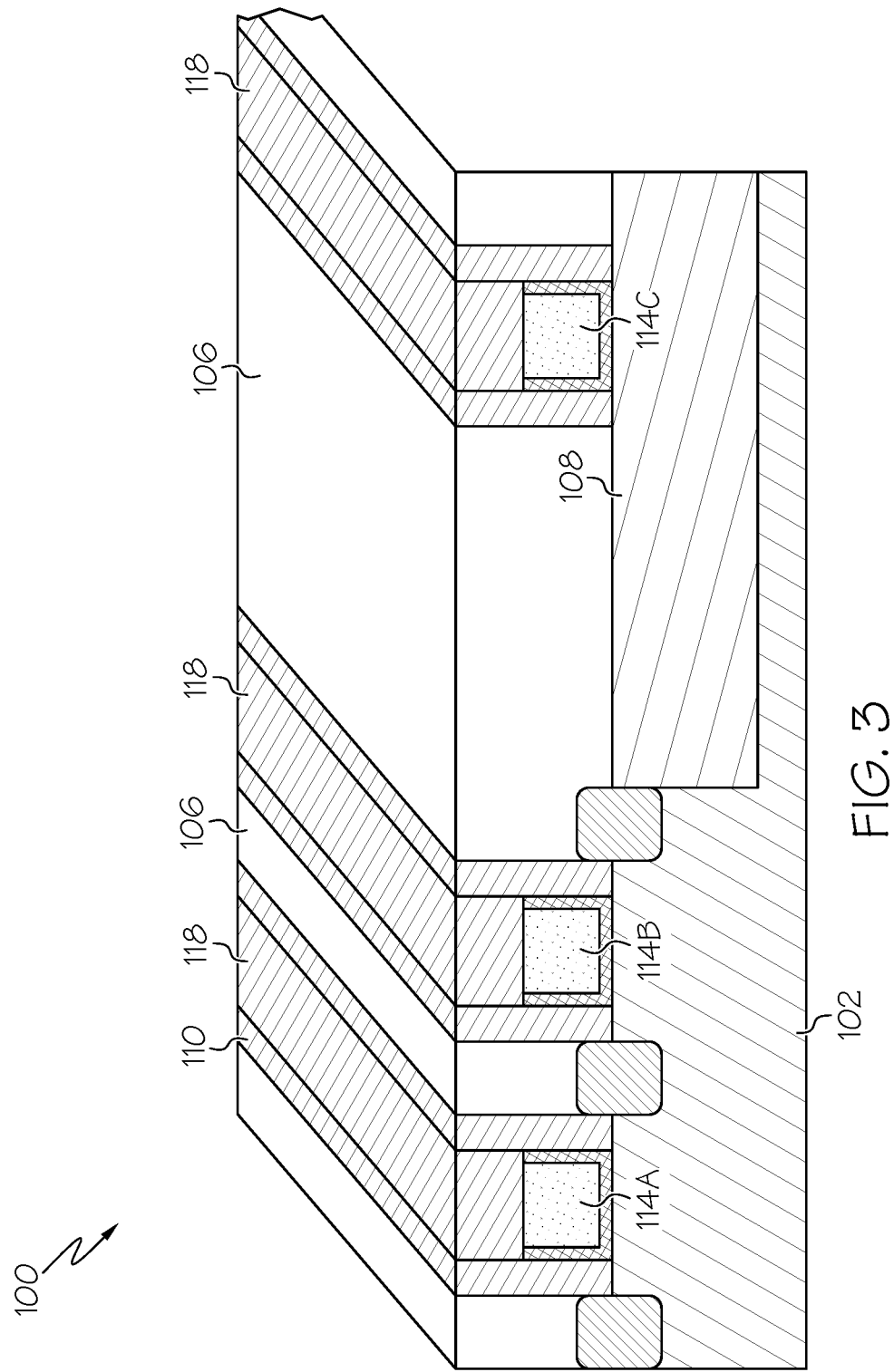
FIG. 3 is a semiconductor structure after a subsequent process step of depositing a capping layer in accordance with illustrative embodiments.

FIG. 3 is semiconductor structure 100 after a subsequent process step of depositing a capping layer 118 in accordance with illustrative embodiments. In embodiments, the capping layer 118 may be comprised of a material similar to that of spacers 110 (e.g. silicon nitride), and may be deposited using a chemical vapor deposition (CVD) process into the trench 116 (FIG. 2). After the deposition of the capping layer 118, a planarization process, such as a chemical mechanical polish (CMP) may be used to make the capping layer 118 flush with the top of the ILD 106.

Figure 4:
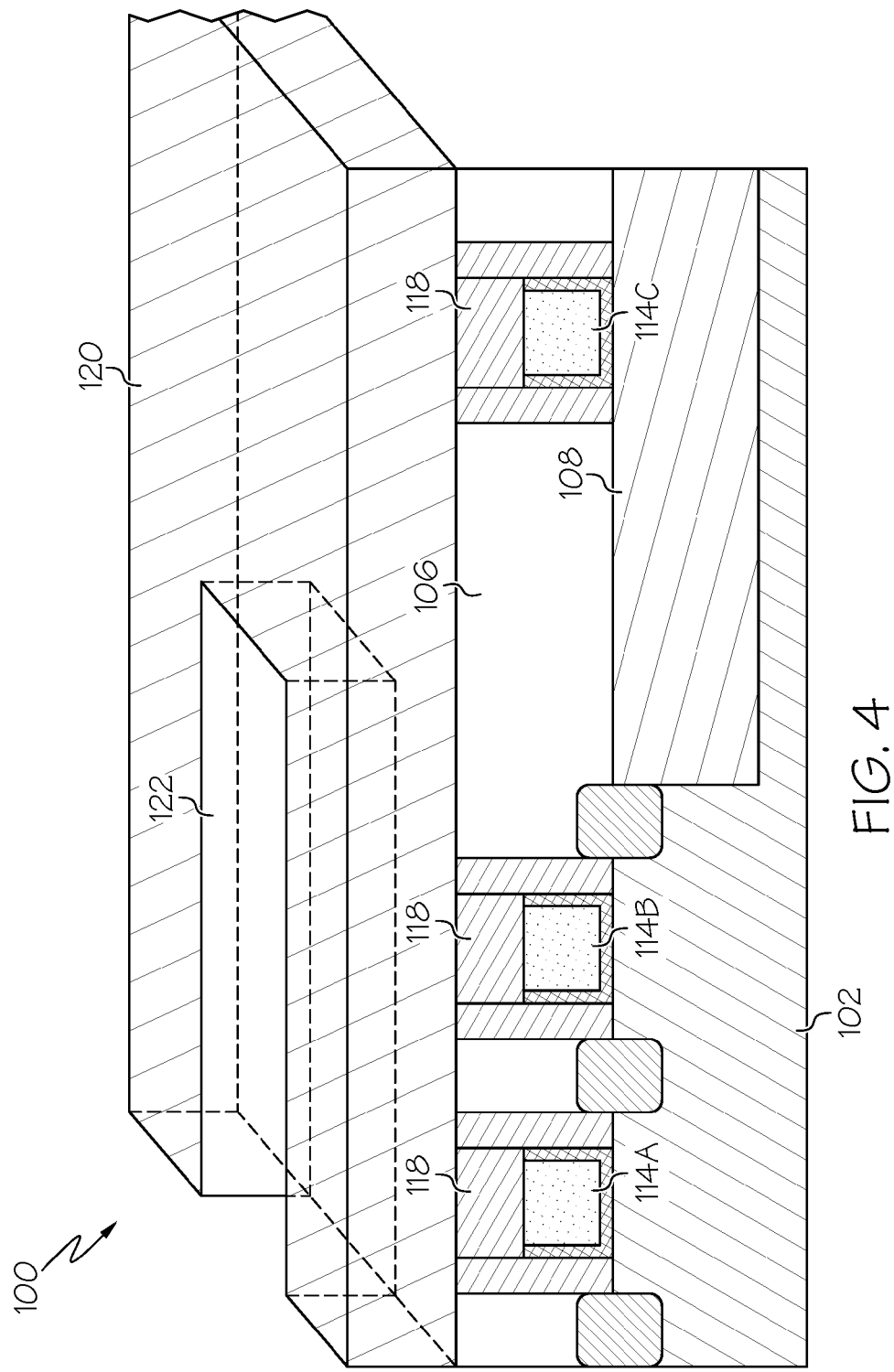
FIG. 4 is a semiconductor structure after a subsequent process step of forming a first mask layer in accordance with illustrative embodiments.

FIG. 4 is semiconductor structure 100 after a subsequent process step of forming a first mask layer 120 in accordance with illustrative embodiments. First mask layer 120 may comprise a photoresist or hardmask. Opening 122 is lithographically formed in the first mask layer 120, exposing a portion of the capping layer 118 disposed above gates 114A and 114B, while not exposing the capping layer disposed above gate 114C.

Figure 5:
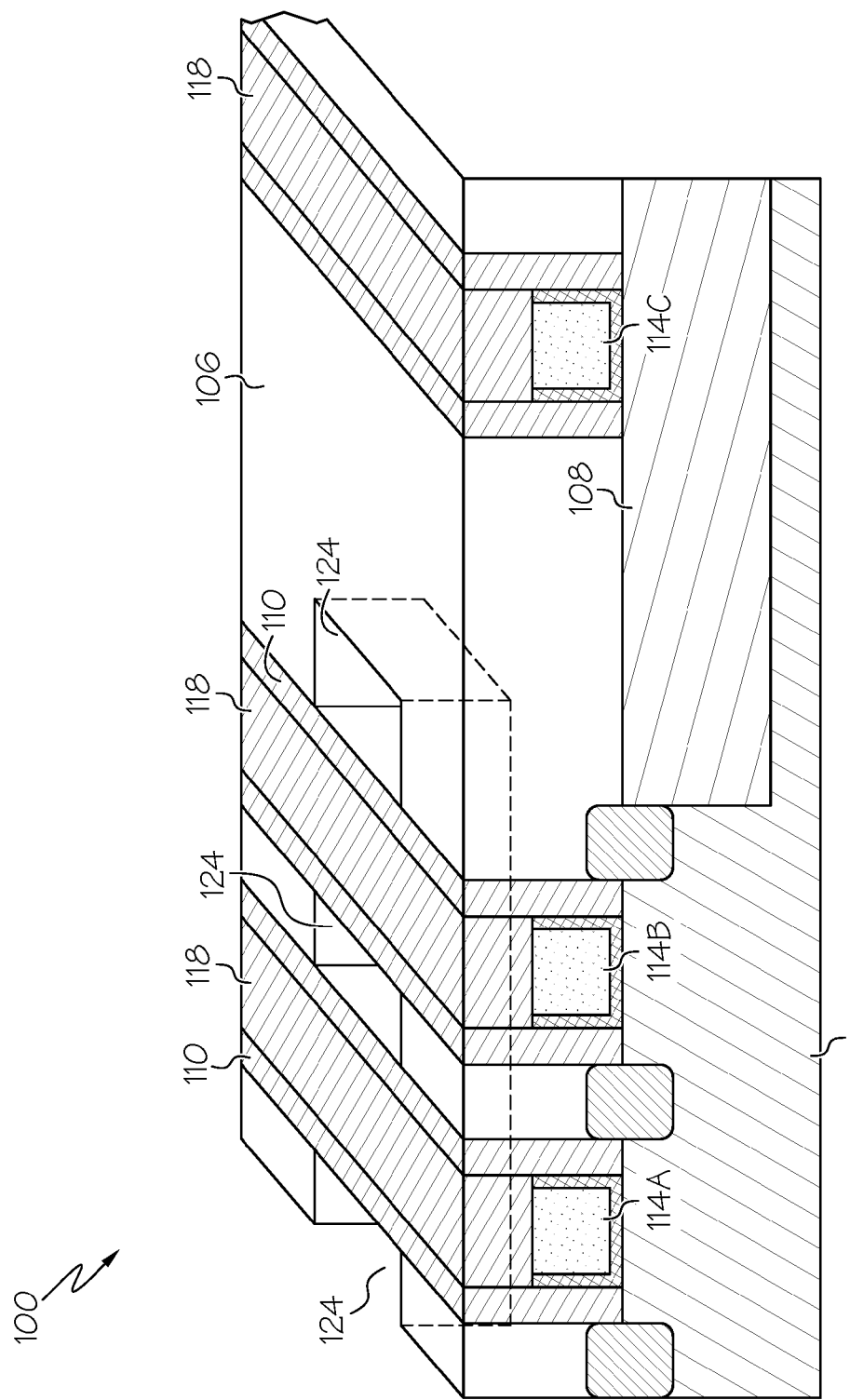
FIG. 5 is a semiconductor structure after a subsequent process step of performing a selective dielectric etch in accordance with illustrative embodiments.

FIG. 5 is semiconductor structure 100 after a subsequent process step of performing a selective dielectric etch in accordance with illustrative embodiments. In embodiments, the selective dielectric etch uses a reactive ion etch (RIE) process, with a much faster etch rate for oxide than nitride. The selective dielectric etch results in the formation of cavities 124 formed in the ILD 106, adjacent to the spacers 110. The purpose of this etch is to provide access to semiconductor source/drain regions. There can be (not shown) a thin layer over source and drain and under the ILD which acts as a Contact Etch Stop Layer (CESL). This CESL may be, for example, a thin conformal nitride of thickness 3 to 15 nm, which is subsequently punched through to allow direct electrical access to the semiconductor. After the etch process, the first mask layer 120 (FIG. 4) may be removed using industry-standard techniques.

Figure 6:
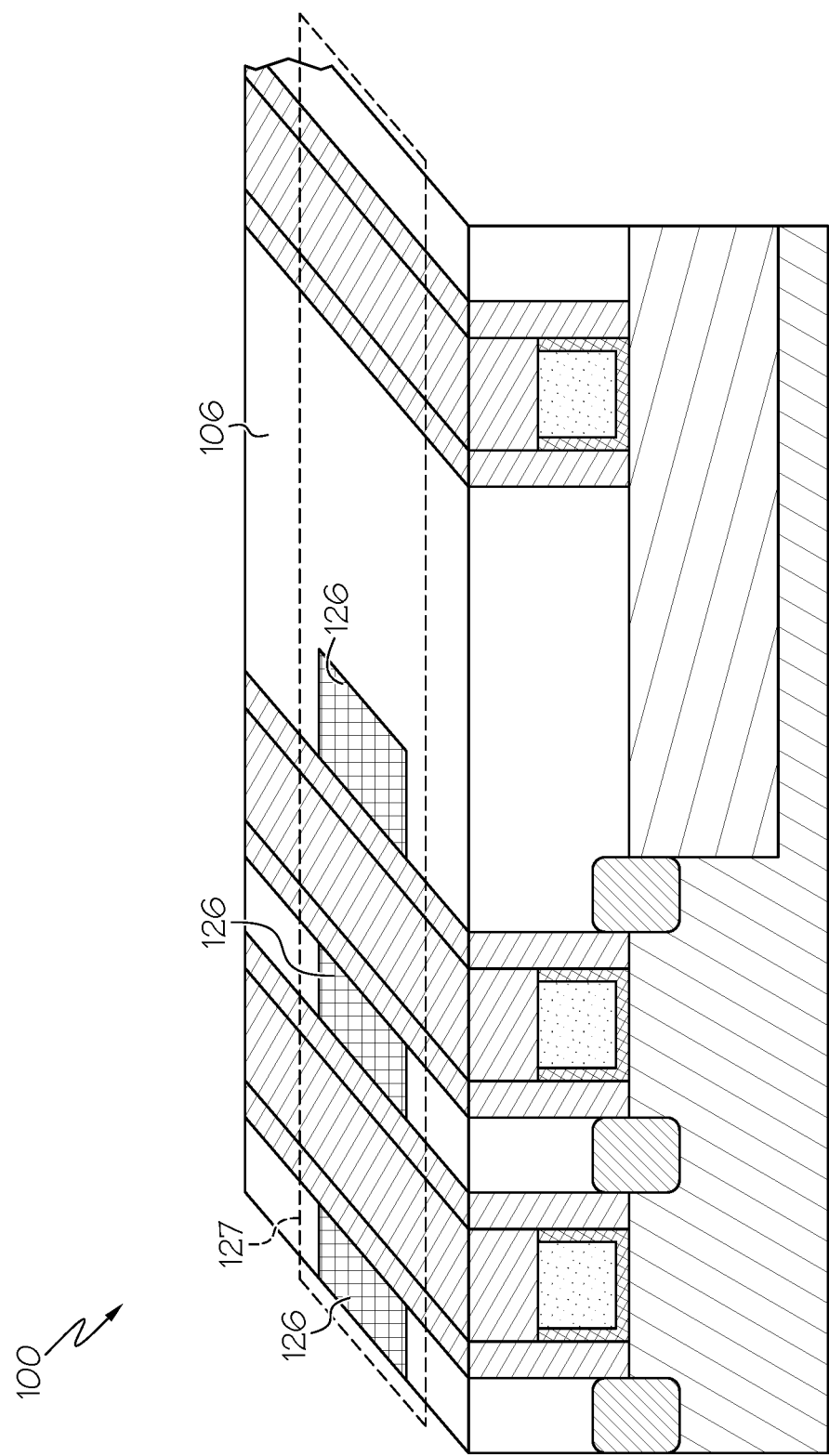
FIG. 6 is a semiconductor structure after a subsequent process step of performing a source/drain metal deposition in accordance with illustrative embodiments.

FIG. 6 is semiconductor structure 100 after a subsequent process step of performing a source/drain metal deposition in accordance with illustrative embodiments to form source/drain metal contact strips 126. The contact strips 126 are self-aligned based on the location of the material that was selectively etched to form the cavities 124 (FIG. 5). The contact strips are metal regions that are at this stage larger than the final contact access plug. In subsequent process steps, the contact strips are partially recessed leaving smaller, full-height areas (132 of FIG. 8) constituting the contact access plugs. In embodiments, the source/drain metal deposition may be performed with a combination of Atomic Layer Deposition (ALD) for a thin liner, typically a bilayer of Ti/TiN, and chemical vapor deposition (CVD) process for the fill metal. A planarization process, such as a chemical mechanical polish (CMP) process may then be used to make the source/drain metal strips 126 flush with the top of the ILD 106. In embodiments, the material for the source/drain metal strips 126 is a different material than that of the gates 114A, 114B, and 114C. In embodiments, the source/drain metal strips 126 may be comprised of cobalt. In other embodiments, the source/drain metal strips 126 may be comprised of copper or tungsten.

Figure 7:
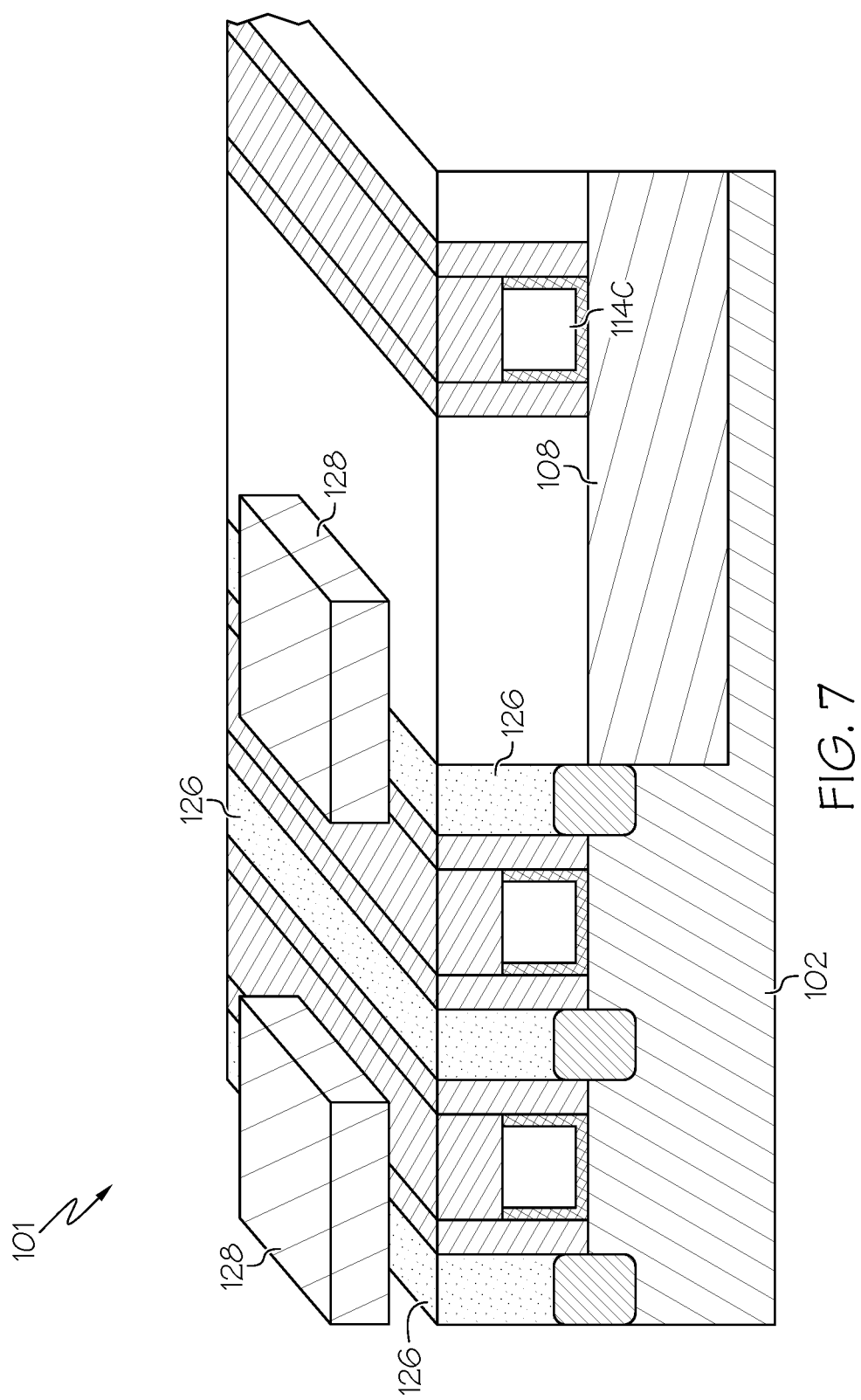
FIG. 7 is a semiconductor structure after a subsequent process step of forming a second mask layer in accordance with illustrative embodiments.

FIG. 7 is a close up view of a portion 101 of semiconductor structure 100, based on the area denoted by box 127 of FIG. 6, after a subsequent process step of forming a second mask layer 128 in accordance with illustrative embodiments. In embodiments, the second mask layer 128 may be comprised of photoresist or hardmask and may be lithographically patterned so that there are multiple areas of second mask layer 128. This lithography may be performed as a single-patterning lithography, since the spacing along the X direction between patterns, as well as the alignment required, are relaxed enough to eliminate the need for a multiple patterning. This simplifies the fabrication process, and is a major advantage of embodiments of the present invention. The regions of second mask layer 128 cover portions of source/drain metal contact strips 126.

Figure 8:
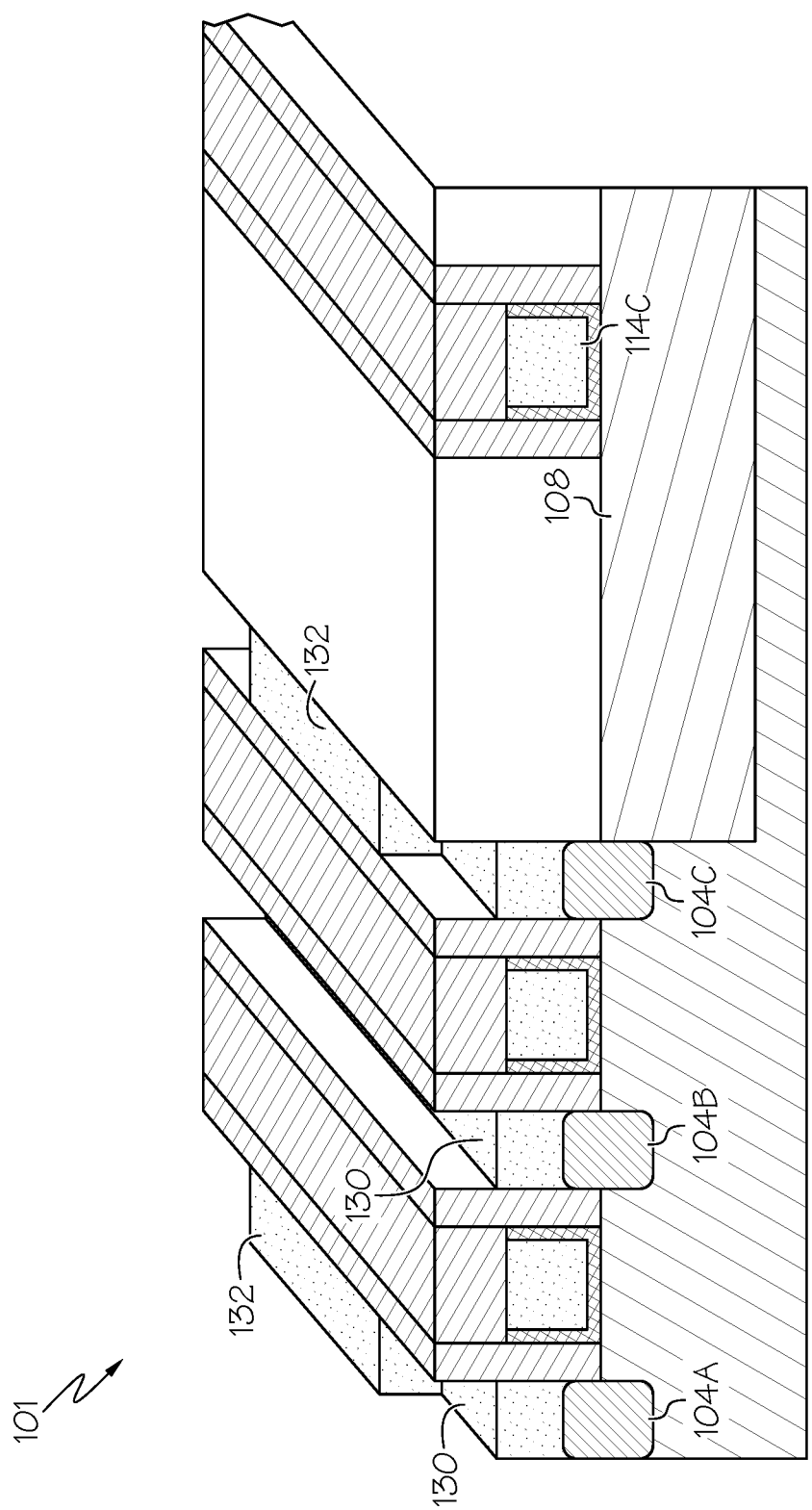
FIG. 8 is a semiconductor structure after a subsequent process step of performing a source/drain metal recess in accordance with illustrative embodiments.
Figure 9:
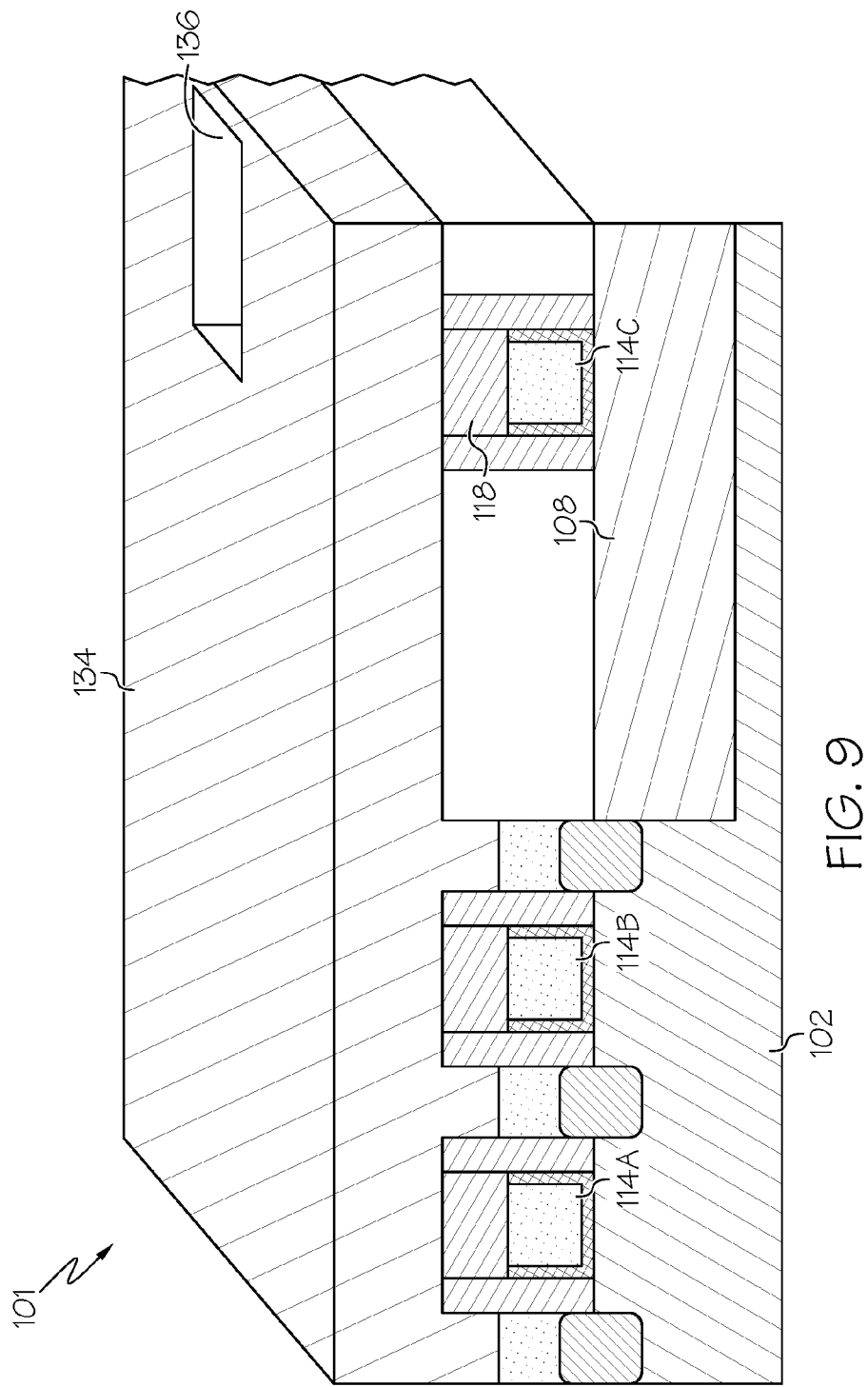
FIG. 9 is a semiconductor structure after a subsequent process step of forming a gate cut mask layer in accordance with illustrative embodiments.

FIG. 8 is a close up view of a portion 101 of semiconductor structure 100, based on the area denoted by box 127 of FIG. 6, after a subsequent process step of performing a source/drain metal recess in accordance with illustrative embodiments. The source/drain metal strip (126 of FIG. 6) is partially etched (recessed) using a selective etch process that etches metal at a much faster rate than oxide or nitride. As a result, the metal strip (126 of FIG. 6) is converted into source/drain contact 132, and a recessed portion 130. Hence, source/drain contact 132 is smaller than source/drain metal contact strip 126 (FIG. 6). Therefore, the entire contact structure comprises an upper, narrow portion 132 having a first width, and a lower, wider portion 130 having a second width that is greater than the first width. In embodiments, the top of the lower portion 130 may be level with the top of the adjacent transistor gate 114A (see FIG. 9). After the etch process, the second mask layer 128 may be removed using industry-standard techniques. However, the lithographical requirements in the X direction (see 109 of FIG. 1) are relaxed due to the reliance on the etch selectivity of the various materials. Furthermore, the dimension of the contact along the X direction is not defined directly by the contact lithography FIG. 9 is a close up view of a portion 101 of semiconductor structure 100, based on the area denoted by box 127 of FIG. 6, after a subsequent process step of forming a gate cut mask layer 134 in accordance with illustrative embodiments. The opening 136 is lithographically formed in the gate cut mask layer 134, exposing a portion of the capping layer 118 disposed above gate 114C, while not exposing the capping layer disposed above gates 114A and 114B.

Figure 10:
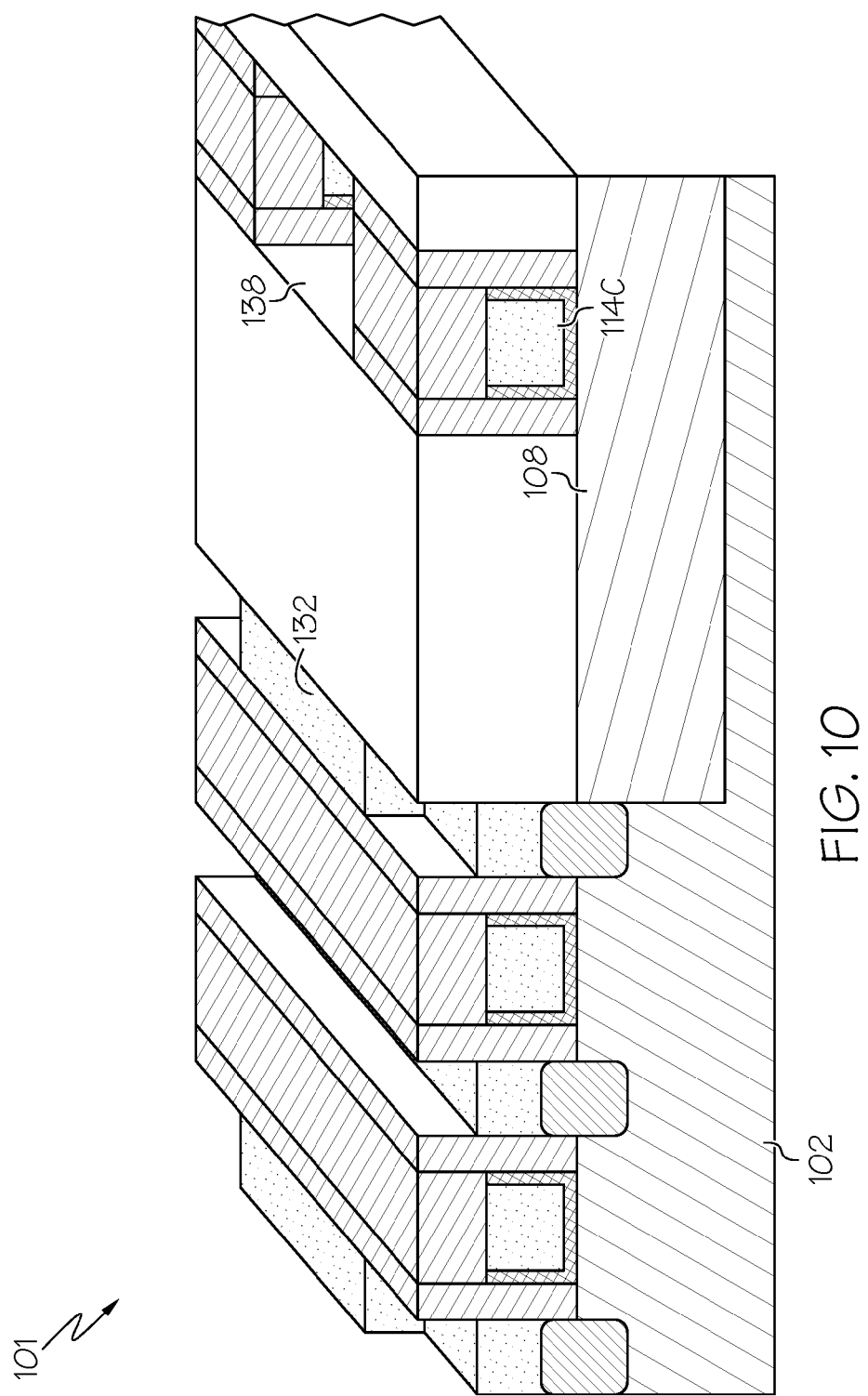
FIG. 10 is a semiconductor structure after a subsequent process step of performing a gate cut in accordance with illustrative embodiments.

FIG. 10 is a close up view of a portion 101 of semiconductor structure 100, based on the area denoted by box 127 of FIG. 6, after a subsequent process step of performing a gate cut in accordance with illustrative embodiments. Using an etch process, a cavity 138 is formed at the location of the opening 136 (FIG. 9) of the gate cut mask layer. Cavity 138 severs the gate 114C, to perform a gate cut. In the fabrication of an integrated circuit, gates and source/drain lines may be cut at various locations to form individual transistors or elements of circuits. In embodiments, such cuts happen over shallow trench isolation (STI) areas.

Figure 11:
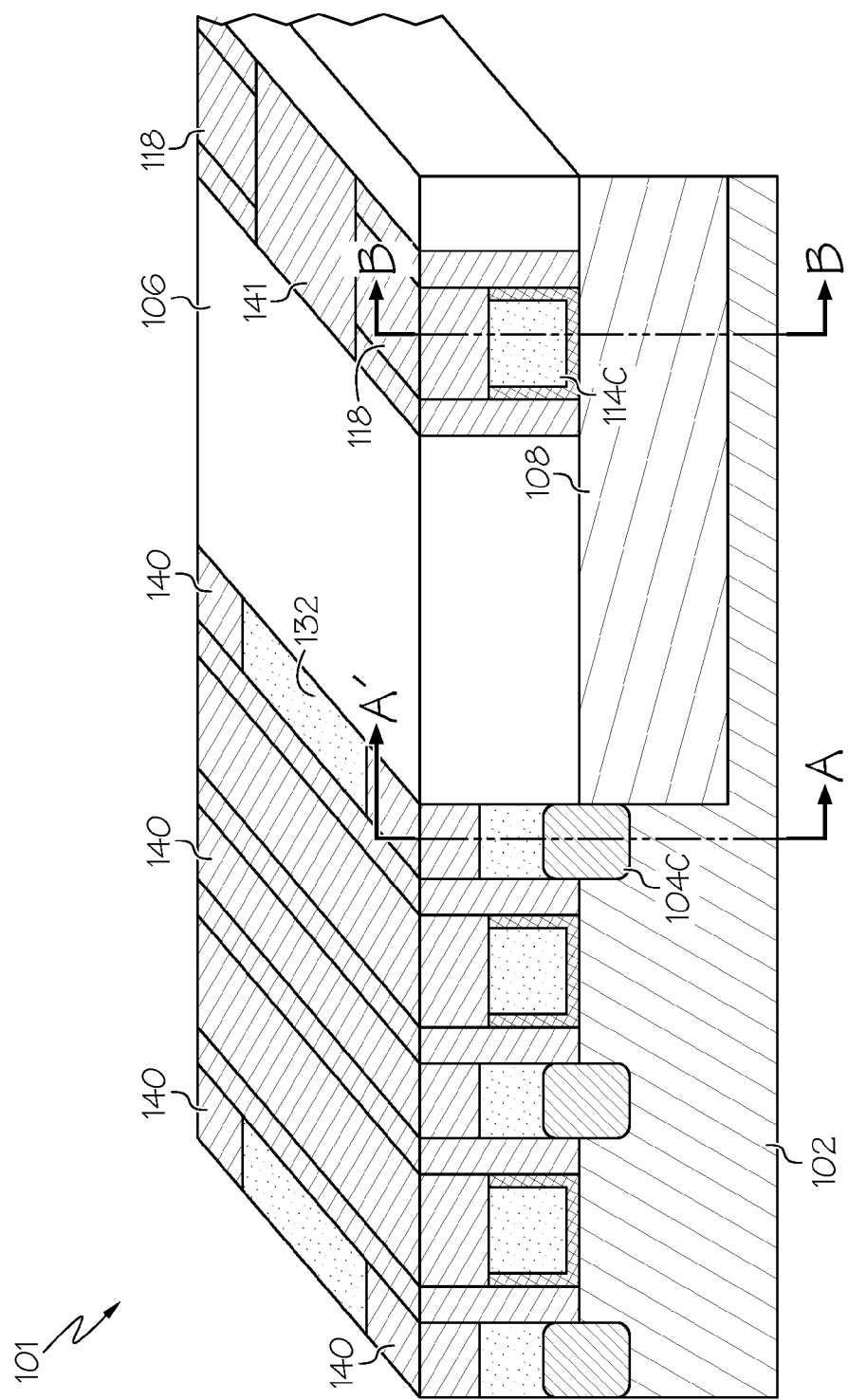
FIG. 11 is a semiconductor structure after a subsequent process step of depositing additional capping layer in accordance with illustrative embodiments.

FIG. 11 is a close up view of a portion 101 of semiconductor structure 100, based on the area denoted by box 127 of FIG. 6, after a subsequent process step of depositing additional capping layer 140 and 141 in accordance with illustrative embodiments. The additional capping layer 140 and 141 may be comprised of the same material as capping layer 118. In embodiments, the capping layer 140 and 141 may be comprised of silicon nitride. The capping layer 141 for the gate cut may be deposited at the same time as capping layer 140 for the source/drain contacts. Thus, a single deposition process may be used for both the gate cut capping layer 141 and the source/drain contact capping layer 140. In embodiments, the capping layers 140 and 141 are deposited using a chemical vapor deposition (CVD) process. In embodiments, after the deposition, a planarization process, such as a chemical mechanical polish (CMP) process is used to make the capping layers 140 and 141 flush with the top of the ILD 106.

FIG. 12A is a perspective view of a semiconductor structure after formation of a source/drain contact in accordance with illustrative embodiments, as viewed along line A-A' of FIG. 11. The source/drain contact 132 provides electrical contact to source/drain region 104C. Capping layer 140 is on each side of source/drain contact 132. FIG. 12B is a side view of the semiconductor structure after formation of a source/drain contact in accordance with illustrative embodiments, as viewed along line A-A' of FIG. 11.

FIG. 13A is a perspective view of a semiconductor structure after a gate cut process in accordance with illustrative embodiments, as viewed along line B-B' of FIG. 11. FIG. 13B is a side view of the semiconductor structure after a gate cut process in accordance with illustrative embodiments, as viewed along line B-B' of FIG. 11. In embodiments, the capping layer 141 traverses the gate 114C, and the gate dielectric 112, and extends into the STI region 108. This electrically disconnects gate 114C from region 114C2.

Figure 14:
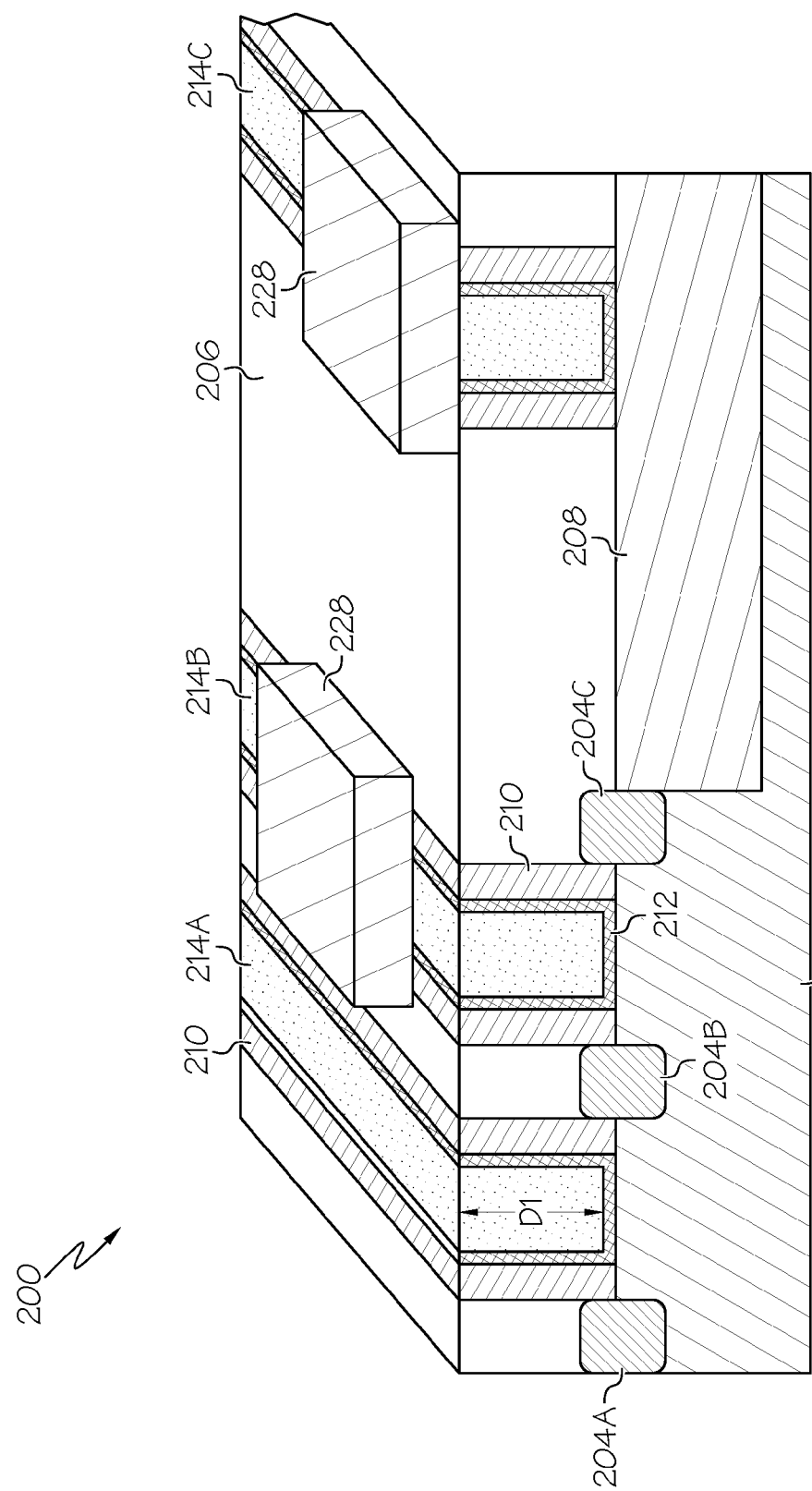
FIG. 14 is a semiconductor structure after a subsequent process step of forming a first mask layer in accordance with alternative illustrative embodiments.

FIG. 14 is a semiconductor structure 200 after a subsequent process step of forming a first mask layer in accordance with alternative illustrative embodiments. Starting from the structure similar to that shown in FIG. 1, a first masking layer 228 is formed on the semiconductor structure. Semiconductor structure 200 includes a semiconductor substrate 202, which may include a silicon substrate, and may be in the form of a silicon wafer. A plurality of source/drain regions (204A, 204B, and 204C) are formed in the semiconductor substrate 202. In embodiments, the source/drain (S/D) regions 204A, 204B, and 204C may be raised source/drain (RSD) structures. The S/D regions may comprise doped silicon regions, and may include additional epitaxial material such as silicon, silicon germanium, and/or additional materials for the purposes of inducing stress to increase carrier mobility. An interlayer dielectric (ILD) 206 is formed over the semiconductor substrate 202. In embodiments, the ILD 206 is comprised of an oxide, such as silicon oxide, and may be formed using a chemical vapor deposition (CVD) process. A plurality of gates 214A, 214B, and 214C are formed in the semiconductor structure. The plurality of gates 214A, 214B, and 214C may be comprised of metal, and may be formed using a replacement metal gate (RMG) process. In embodiments, the gates 214A, 214B, and 214C may be comprised of tungsten for the metal fill, and a thin layer of a workfunction metal (not shown) of TiAl, TaN, or TiN may be disposed under the tungsten. The gates 214A, 214B, and 214C have a thickness D1. In embodiments, D1 may range from about 100 nanometers to about 200 nanometers. As shown in the cross section of FIG. 14, gates 214A and 214B are disposed between S/D regions. Gate 214C is disposed over a shallow trench isolation (STI) region 208. In embodiments, the STI region 208 is comprised of an oxide, such as silicon oxide. A gate dielectric layer 212 is in contact with the gates (214A, 214B, and 214C). In embodiments, the gate dielectric layer 212 may comprise an oxide. In some embodiments, the gate dielectric layer 212 may comprise a high-K material such as hafnium oxide or zirconium oxide. Spacers 210 are formed adjacent to the gates. In embodiments, the spacers 210 are formed of a nitride, such as silicon nitride or lower K SiOCN material. In embodiments, the first mask layer 228 may be comprised of photoresist or hardmask and may be lithographically patterned so that there are multiple areas of first mask layer 228. One of the advantages of embodiments of the present invention is that it enables the use of a single patterning lithography by exploiting the etch selectivity of the materials.

Figure 15:
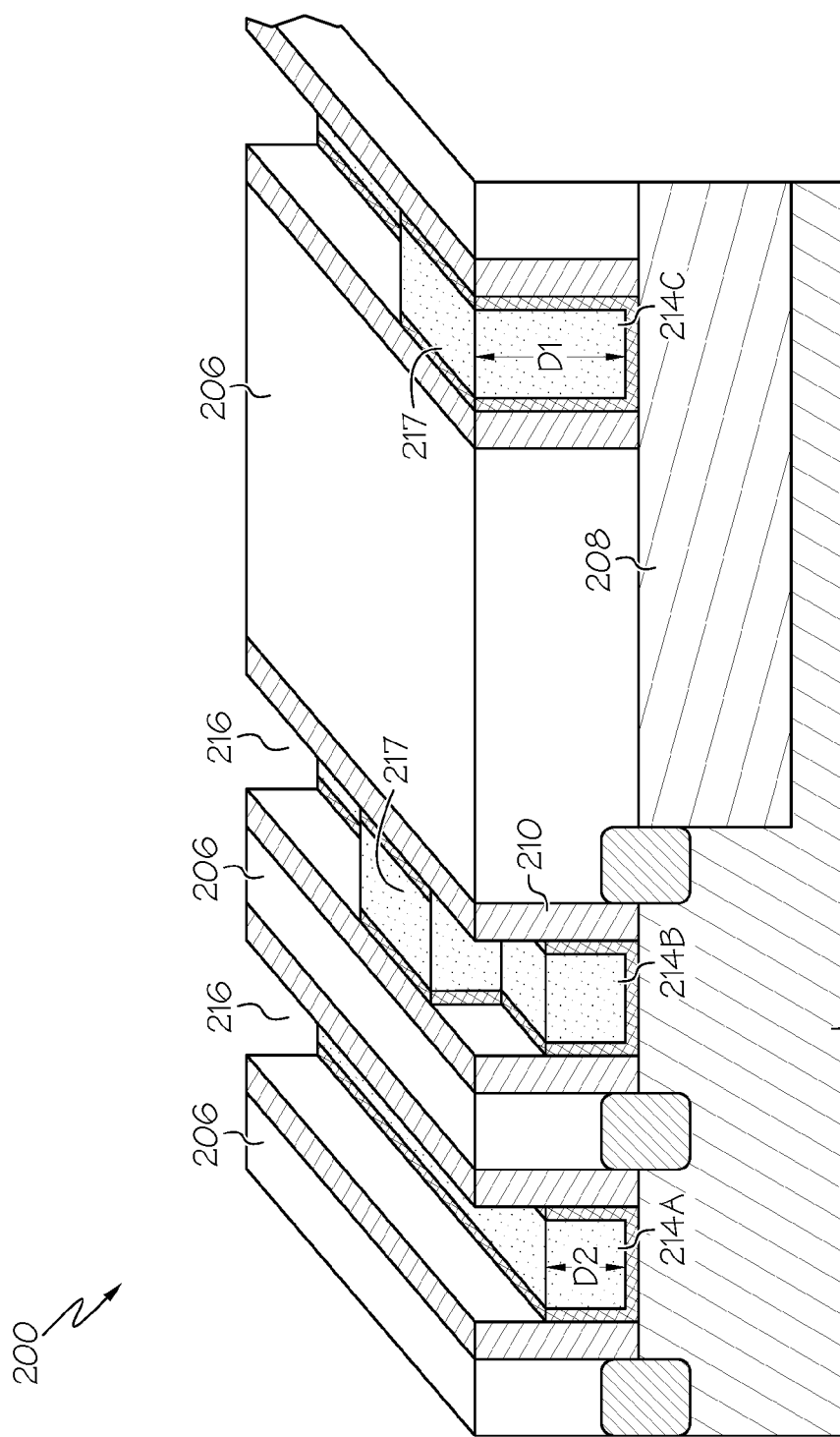
FIG. 15 is a semiconductor structure after a subsequent process step of performing a gate metal recess in accordance with illustrative embodiments.

FIG. 15 is semiconductor structure 200 after a subsequent process step of performing a partial gate metal recess in accordance with illustrative embodiments. A selective etch process is used to etch the metal gate material to a reduced thickness D2 (compared with D1 of FIG. 14), resulting in formation of a cavity (trench) 216 where the gate material is removed. In embodiments, the thickness D2 ranges from about 50 nanometers to about 90 nanometers. The selective etch process may include a wet etch, dry etch, or combination of the two. The selective etch has a much faster etch rate for metal than for silicon-based oxide or nitride, so the ILD 206 and spacers 210 are preserved, whereas exposed portions of the gates 214A, 214B, and 214C, along with the corresponding gate dielectric 212, are recessed. The etch is a partial etch, as the portions of the gates 214B and 214C that are covered by the mask layer 228 (FIG. 14) are not recessed, and serve as gate contacts 217. After the etch process, the first mask layer 228 may be removed using industry-standard techniques.

Figure 16:
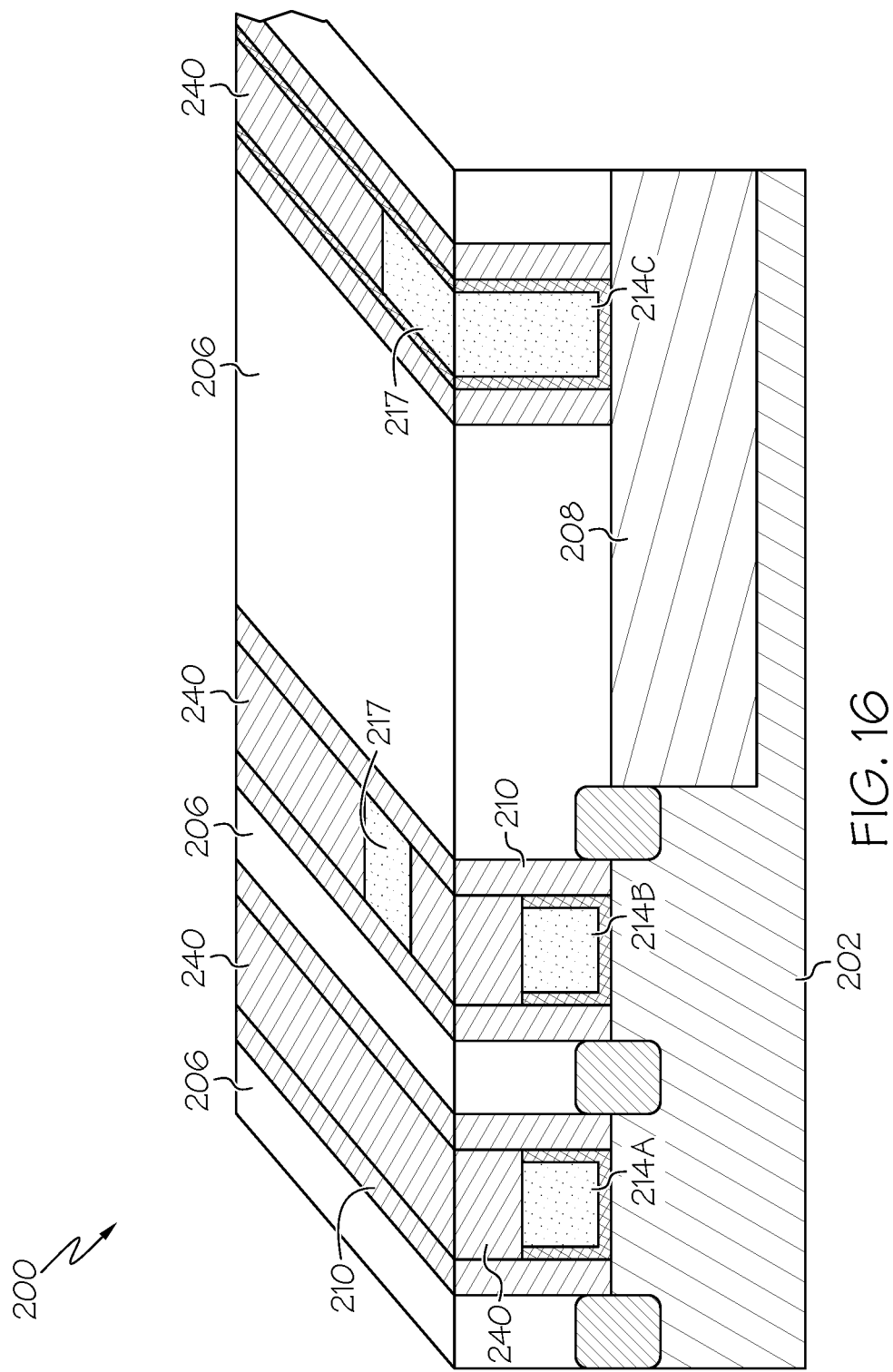
FIG. 16 is a semiconductor structure after a subsequent process step of depositing a capping layer in accordance with illustrative embodiments.

FIG. 16 is semiconductor structure 200 after a subsequent process step of depositing a capping layer 240 in accordance with illustrative embodiments. In embodiments, the capping layer 240 is comprised of a similar material as spacers 210 (e.g. silicon nitride), and may be deposited using a chemical vapor deposition (CVD) process into the trench 216 (FIG. 15). After the deposition of the capping layer 240, a planarization process, such as a chemical mechanical polish (CMP) may be used to make the capping layer 240 flush with the top of the ILD 206.

Figure 17:
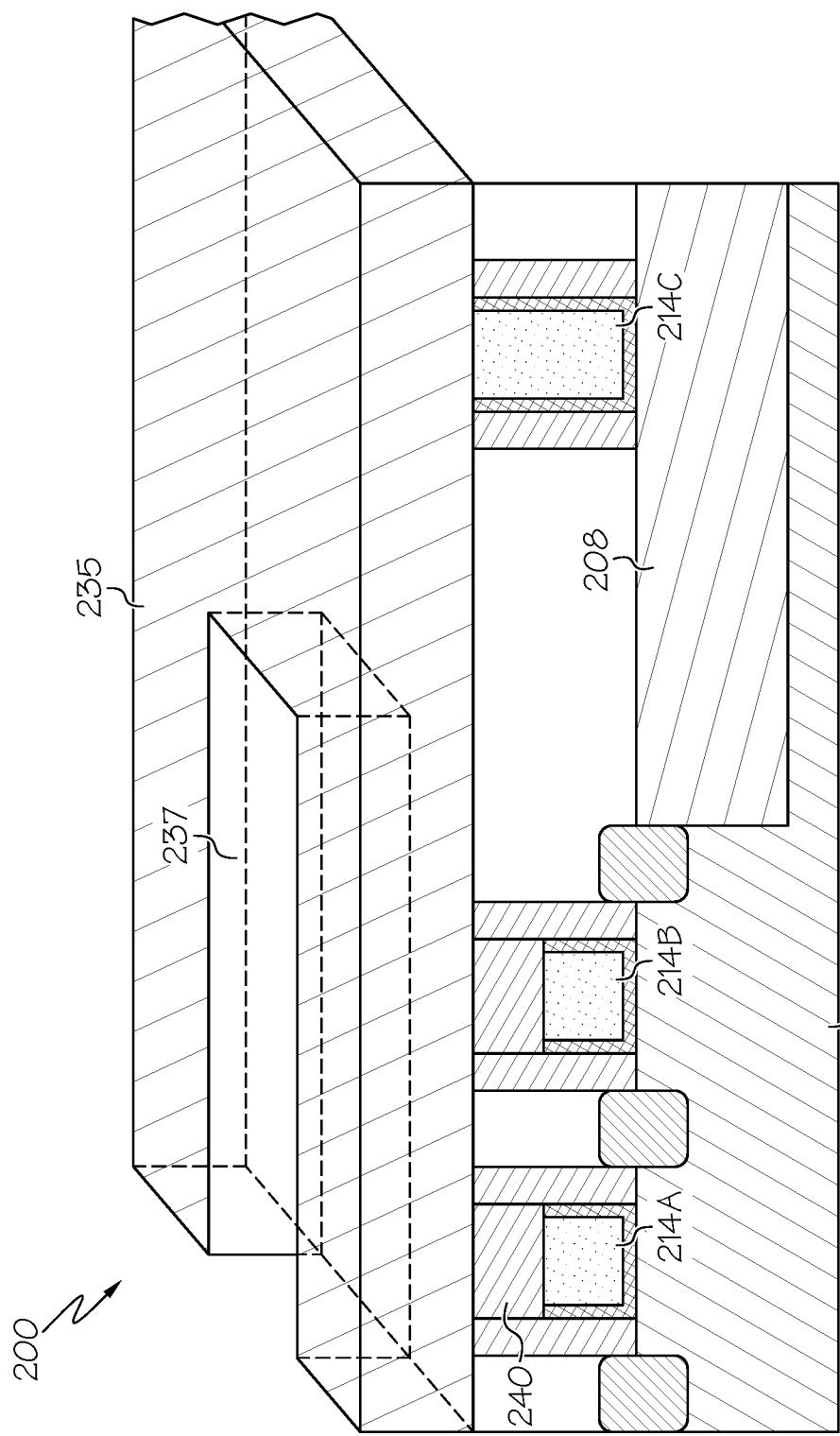
FIG. 17 is a semiconductor structure after a subsequent process step of forming a second mask layer in accordance with illustrative embodiments.

FIG. 17 is a semiconductor structure after a subsequent process step of forming a second mask layer 235 in accordance with illustrative embodiments. Second mask layer 235 may comprise a photoresist or hardmask. Opening 237 is lithographically formed in the second mask layer 235, exposing a portion of the capping layer 240 disposed above gates 214A and 214B, while not exposing the capping layer disposed above gate 214C.

Figure 18:
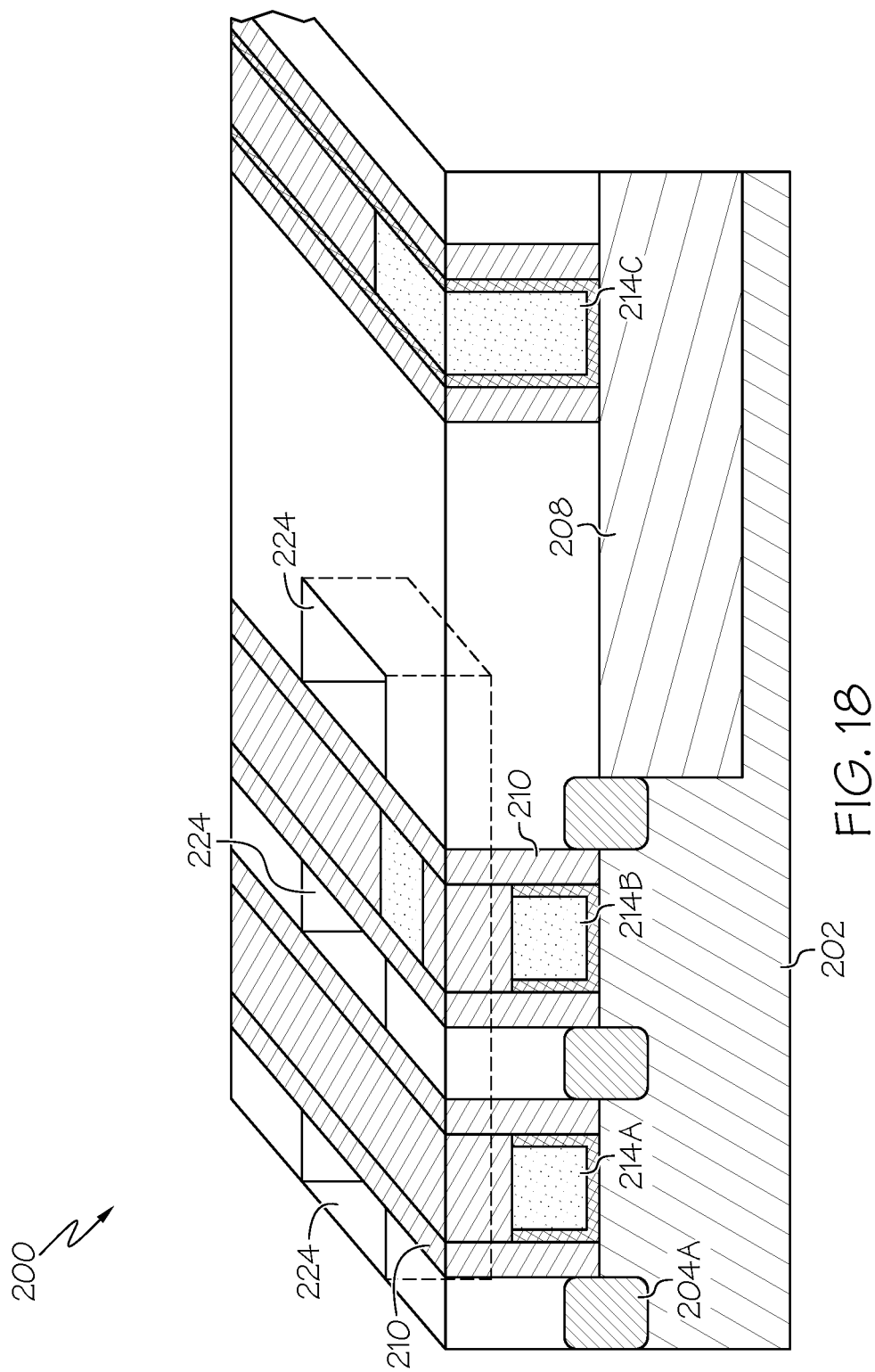
FIG. 18 is a semiconductor structure after a subsequent process step of performing a selective dielectric etch in accordance with illustrative embodiments.

FIG. 18 is semiconductor structure 200 after a subsequent process step of performing a selective dielectric etch in accordance with illustrative embodiments. In embodiments, the selective dielectric etch uses a reactive ion etch (RIE) process, with a much faster etch rate for oxide than nitride. The selective dielectric etch results in the formation of cavities 224 formed in the ILD 206, adjacent to the spacers 210. After the etch process, the second mask layer 235 (FIG. 18) may be removed using industry-standard techniques.

Figure 19:
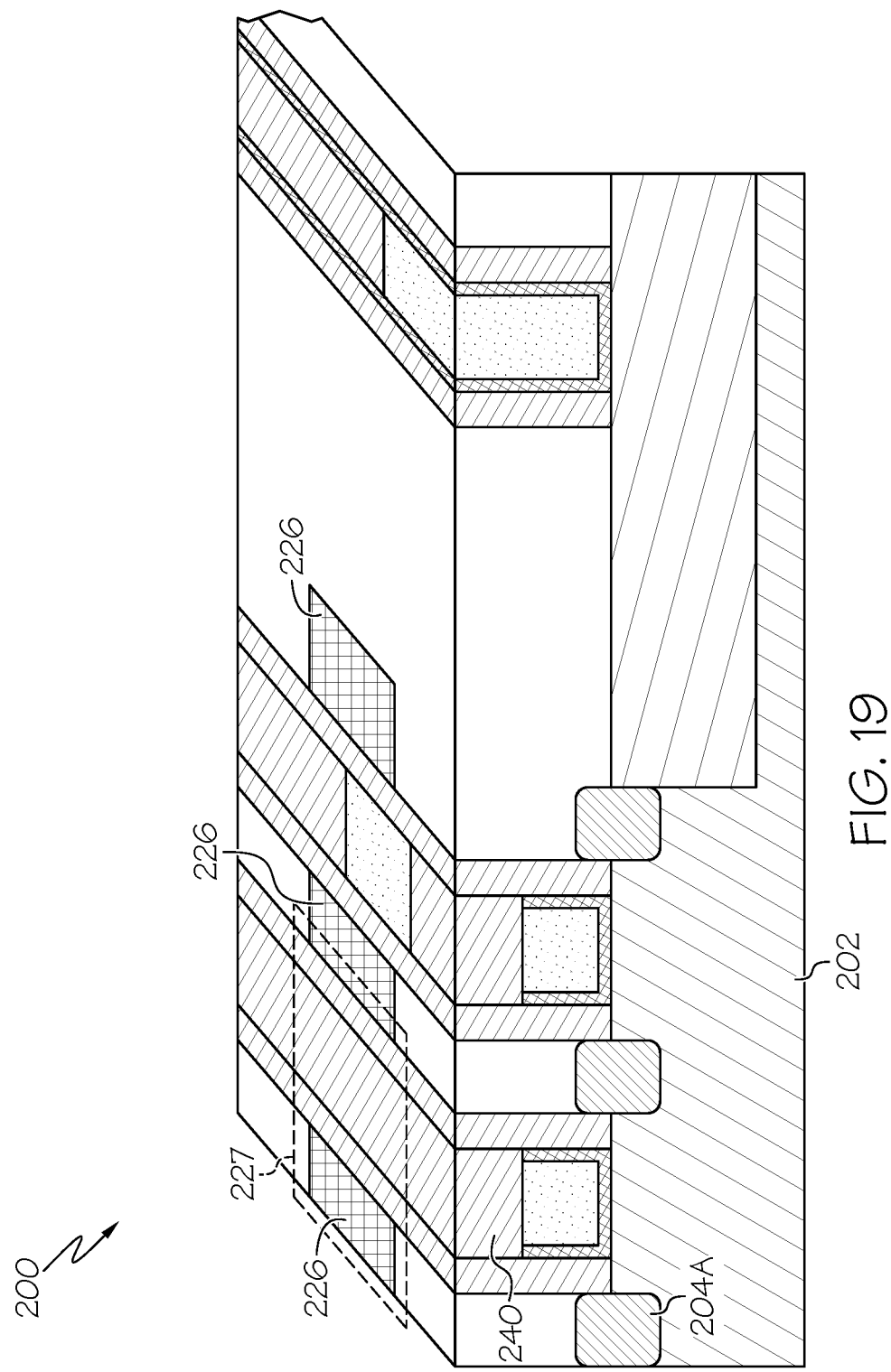
FIG. 19 is a semiconductor structure after a subsequent process step of performing a source/drain metal deposition in accordance with illustrative embodiments.

FIG. 19 is semiconductor structure 200 after a subsequent process step of performing a source/drain metal deposition in accordance with illustrative embodiments. In embodiments, the source/drain metal deposition may be performed with a combination of atomic layer deposition (ALD) and chemical vapor deposition (CVD) process. A planarization process, such as a chemical mechanical polish (CMP) process may then be used to make the source/drain metal strips 226 flush with the top of the ILD 206. In embodiments, the material for the source/drain metal strips 226 is a different material than that for the gates 214A, 214B, and 214C. In embodiments, the source/drain metal strips 226 are comprised of cobalt. In other embodiments, the source/drain metal strips 226 are comprised of copper.

Figure 20:
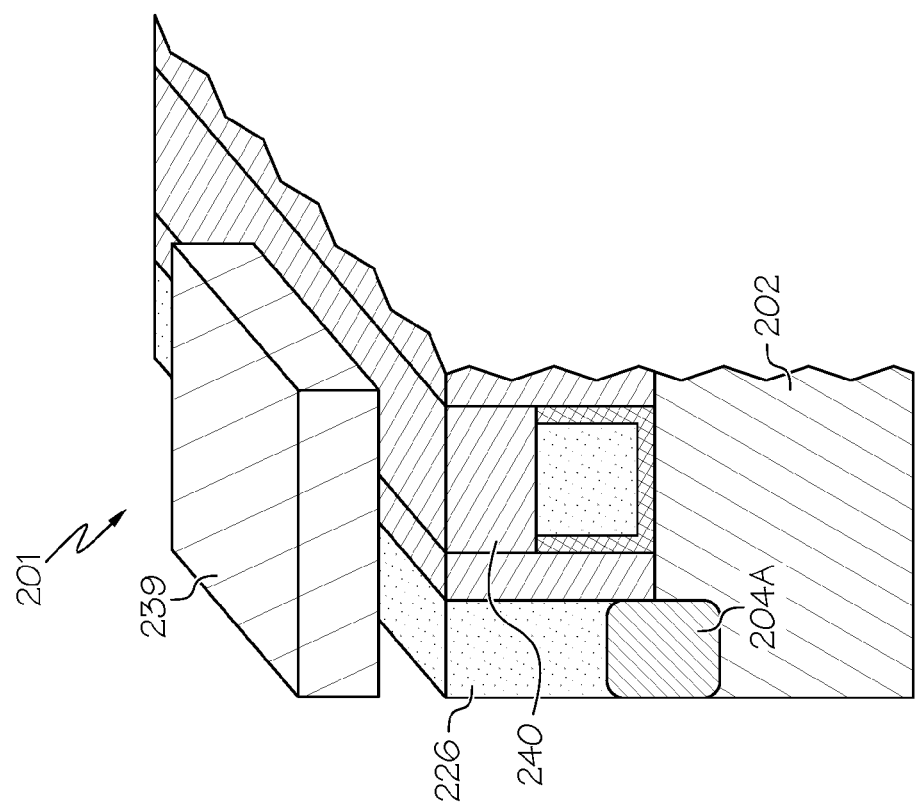
FIG. 20 is a semiconductor structure after a subsequent process step of forming a third mask layer in accordance with illustrative embodiments.

FIG. 20 is a close up view of a portion 201 of semiconductor structure 200, based on the area denoted by box 227 of FIG. 19, after a subsequent process step of forming a third mask layer 239 in accordance with illustrative embodiments. The third mask layer 239 may be comprised of photoresist or hardmask and may be lithographically patterned so that it covers a portion of the source/drain metal strips 226 disposed above source/drain 204A.

Figure 21:
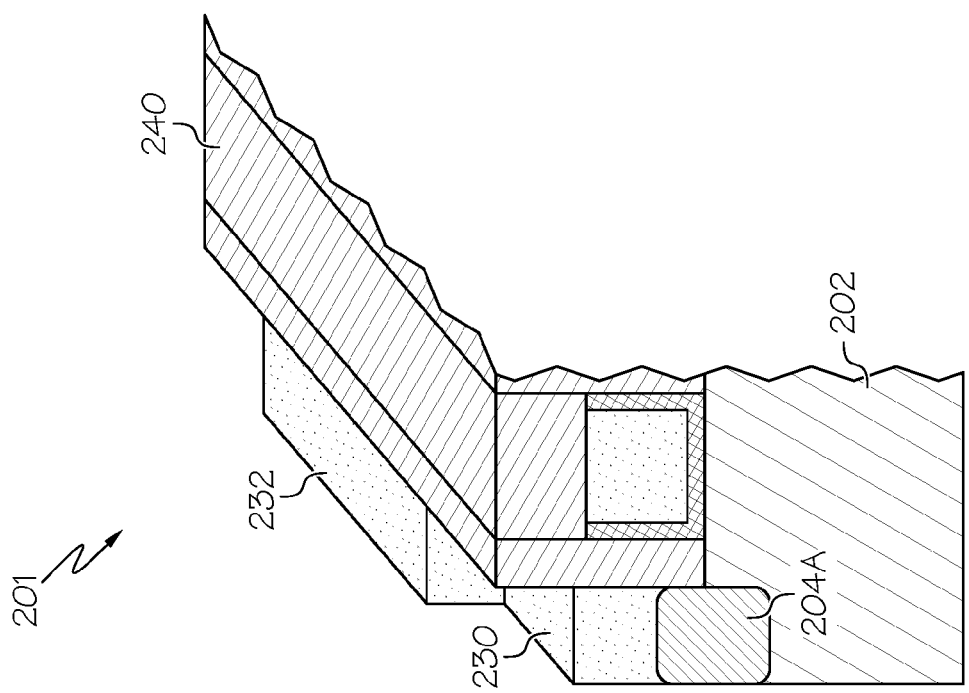
FIG. 21 is a semiconductor structure after a subsequent process step of performing a source/drain metal recess in accordance with illustrative embodiments.

FIG. 21 is a close up view of a portion 201 of semiconductor structure 200, based on the area denoted by box 227 of FIG. 19, after a subsequent process step of performing a source/drain metal recess in accordance with illustrative embodiments. The source/drain metal strip (226 of FIG. 20) is etched using a selective etch process that etches metal at a much faster rate than oxide or nitride. As a result, the metal strip (226 of FIG. 20) is converted into source/drain contact 232, and a recessed portion 230. After the etch process, the third mask layer 239 may be removed using industry-standard techniques.

Figure 22:
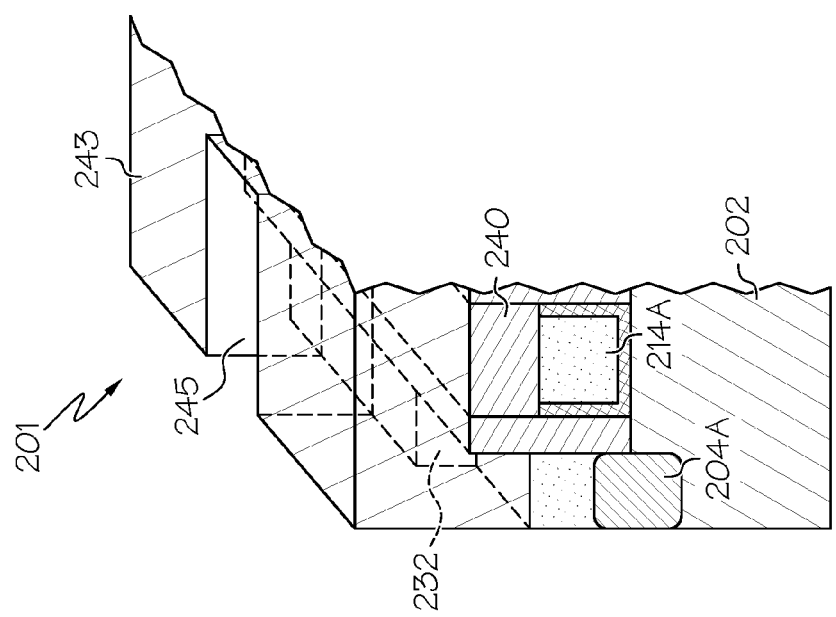
FIG. 22 is a semiconductor structure after a subsequent process step of forming a fourth mask layer in accordance with illustrative embodiments.

FIG. 22 is a close up view of a portion 201 of semiconductor structure 200, based on the area denoted by box 227 of FIG. 19, after a subsequent process step of forming a fourth mask layer 243 in accordance with illustrative embodiments. Fourth mask layer 243 may comprise a photoresist or hardmask. Opening 245 is lithographically formed in the fourth mask layer 243, exposing a portion of the capping layer 240 disposed above gate 214A, and also exposing a portion of source/drain contact 232 that is disposed above source/drain 204A.

Figure 23:
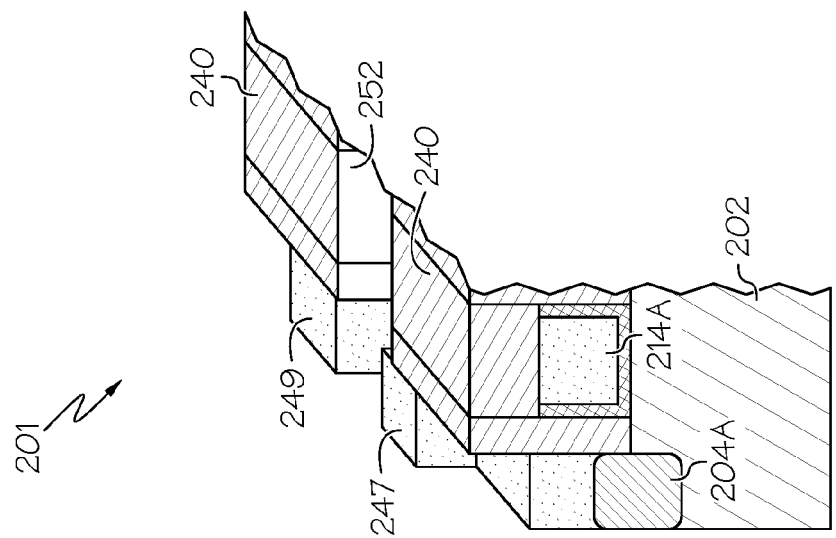
FIG. 23 is a semiconductor structure after a subsequent process step of performing a simultaneous gate cut and source/drain cut in accordance with illustrative embodiments.

FIG. 23 is a close up view of a portion 201 of semiconductor structure 200, based on the area denoted by box 227 of FIG. 19, after a subsequent process step of performing a simultaneous gate cut and source/drain cut in accordance with illustrative embodiments. Using an etch process, a cavity 252 is formed at the location of the opening 245 of the fourth mask layer 243 (FIG. 22). Cavity 252 severs the gate 214A, to perform a gate cut. Simultaneously, the source/drain contact 232 (FIG. 22) is also cut to form separate source/drain contacts 247 and 249. In the fabrication of an integrated circuit, gates and source/drain lines may be cut at various locations to form individual transistors or elements of circuits.

Figure 24:
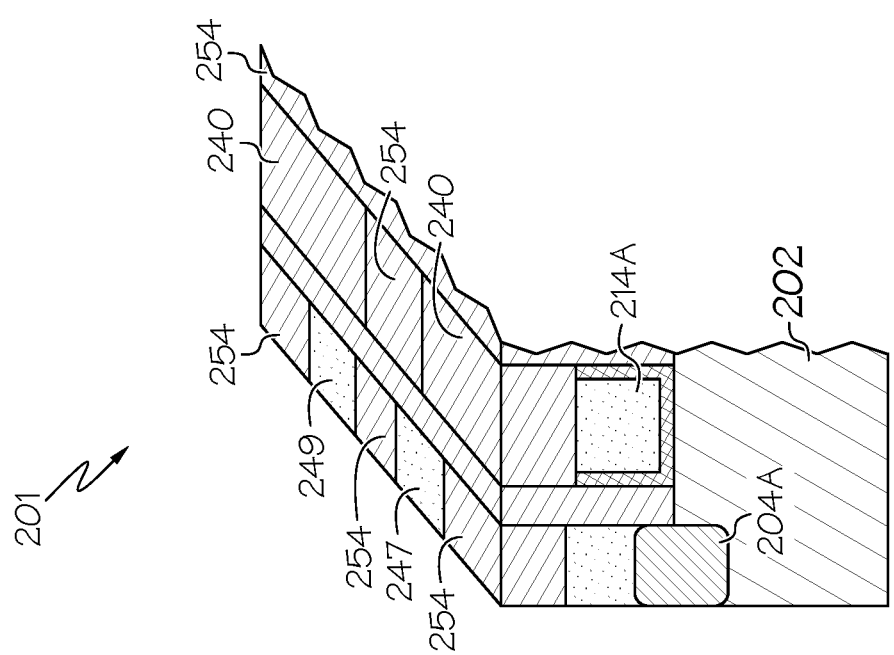
FIG. 24 is a semiconductor structure after a subsequent process step of depositing a capping layer in accordance with illustrative embodiments.

FIG. 24 is a close up view of a portion 201 of semiconductor structure 200, based on the area denoted by box 227 of FIG. 19, after a subsequent process step of depositing a capping layer 254 in accordance with illustrative embodiments. The capping layer 254 may be comprised of the same material as capping layer 240. In embodiments, the capping layer 254 may be comprised of silicon nitride. In embodiments, the capping layer 254 is deposited using a chemical vapor deposition (CVD) process. In embodiments, after the deposition, a planarization process, such as a chemical mechanical polish (CMP) process is used to make the capping layer 254 flush with the top of the source/drain contacts 247 and 249. Thus, embodiments of the present invention provide a method to simultaneously perform a gate cut and a source/drain cut, which saves process steps.

FIG. 25 is a flowchart 2600 indicating process steps for embodiments of the present invention. In process step 2650, gates are formed (e.g. using an RMG process). In process step 2652, the gates are recessed, such as by using a selective etch process. In process step 2654 a capping layer is deposited over the recessed gates. In embodiments, the capping layer may include a silicon nitride layer. A planarization process may follow the deposition of the capping layer. In process step 2656, a first mask layer is formed. In process step 2658, a dielectric etch is performed. This may be performed with a reactive ion etch (RIE) process. The dielectric etch forms cavities that expose source/drain regions. In process step 2660, a metal is deposited in the cavities to form contact strips. In process step 2662, a second mask layer is formed over the contact strips. In process step 2664, source/drain contacts are formed. This entails recessing the source/drain contact strips based on the position of the second mask layer. From this point forward, industry-standard techniques may be used to complete the fabrication of the integrated circuit (IC). This may include formation of additional dielectric layers, via layers, and metallization layers, as well as packaging processes.

FIG. 26 is a flowchart 2700 indicating process steps for alternative embodiments of the present invention. In process step 2750, gates are formed (e.g. using an RMG process). In process step 2752, a first mask layer is formed over one or more gates. In process step 2754, the gates are recessed, such as by using a selective etch process. In process step 2756, a capping layer is deposited over the recessed gates. In embodiments, the capping layer may include a silicon nitride layer. A planarization process may follow the deposition of the capping layer. In process step 2758, a second mask layer is formed. In process step 2760, a dielectric etch is performed. This may be performed with a reactive ion etch (RIE) process. The dielectric etch forms cavities that expose source/drain regions. In process step 2762, a metal is deposited in the cavities to form source/drain contacts. From this point forward, industry-standard techniques may be used to complete the fabrication of the integrated circuit (IC). This may include formation of additional dielectric layers, via layers, and metallization layers, as well as packaging processes.

As can now be appreciated, embodiments of the present invention enable placement of contacts in very close proximity to each other, which allows for increased circuit density, while taking advantage of material selectivity at etch to relax requirements for lithography and perform single patterning in place of multiple patterning at the contact level. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
   forming a plurality of gates in a dielectric layer;
   depositing a first patterned mask over the plurality of gates disposed in a dielectric layer;
   performing a recess of the plurality of gates;
   depositing a capping layer over the plurality of gates;
   depositing a second mask layer having a patterned opening therein, the patterned opening disposed over the capping layer and a region adjacent to the capping layer;
   performing a selective dielectric etch within the patterned opening to form a plurality of source/drain (S/D) cavities; and
   depositing an S/D contact metal in the S/D cavities.

2. The method of claim 1, wherein depositing a capping layer comprises depositing a layer comprised of silicon nitride.

3. The method of claim 2, further comprising planarizing the capping layer flush with the dielectric layer.

4. The method of claim 1, further comprising planarizing the source/drain contact metal flush with the dielectric layer.

5. The method of claim 4, wherein planarizing the source/drain contact metal is performed using a chemical mechanical polish process.

6. The method of claim 1, wherein depositing a first patterned mask over the plurality of gates disposed in a dielectric layer comprises using a single-patterning lithography.

7. The method of claim 6, wherein depositing a source/drain contact metal comprises depositing a material selected from the group consisting of cobalt, tungsten, and copper.

* * * * *